US006103445A

United States Patent [19]
Willson et al.

[11] Patent Number: 6,103,445
[45] Date of Patent: Aug. 15, 2000

[54] PHOTORESIST COMPOSITIONS COMPRISING NORBORNENE DERIVATIVE POLYMERS WITH ACID LABILE GROUPS

[75] Inventors: C. Grant Willson; Uzodinma Okoroanyanwu; David Medieros, all of Austin, Tex.

[73] Assignee: Board of Regents, The University of Texas System, Austin, Tex.

[21] Appl. No.: 08/814,719

[22] Filed: Mar. 7, 1997

[51] Int. Cl.[7] .................................................. G03C 1/492
[52] U.S. Cl. ........................................................ 430/270.1
[58] Field of Search ............................ 430/270.1, 285.1, 430/914, 921, 908

[56] References Cited

U.S. PATENT DOCUMENTS

| | | | |
|---|---|---|---|
| 4,106,943 | 8/1978 | Ikeda et al. | 96/115 R |
| 4,491,628 | 1/1985 | Ito et al. | 430/176 |
| 4,571,375 | 2/1986 | Benedikt | 430/197 |
| 4,902,556 | 2/1990 | Benedikt et al. | 428/209 |
| 5,283,115 | 2/1994 | Shinohara et al. | 428/195 |
| 5,356,752 | 10/1994 | Cabrera et al. | 430/270 |
| 5,362,607 | 11/1994 | Crivello et al. | 430/326 |
| 5,843,624 | 12/1998 | Houlihan et al. | 430/296 |

FOREIGN PATENT DOCUMENTS

| | | |
|---|---|---|
| 0 836 119 A1 | 10/1997 | European Pat. Off. . |
| 59-154441 | 2/1983 | Japan . |
| 59-01556 | 1/1984 | Japan . |
| 59-1556 | 1/1984 | Japan . |
| 1-217453 | 8/1989 | Japan . |
| 52-97591 | 11/1993 | Japan . |

OTHER PUBLICATIONS

Allen et al, Proc. SPIE, vol. 2438, Feb. 20–22, 1995, p. 474.
English abstract for JP 5297591.
English abstract for JP 01217453.
English abstract for JP 5901556.
Allen et al., *J. Photopolym. Sci. Technol.*, 6(4):575, 1993, Designing High Performance KrF and ArF Single Layer Resists With Methacrylate Polymers.
Allen et al., *J. Photopolym. Sci. Technol.*, 9(3):465–474, 1996, Progress in 193 nm Positive Resists.
Allen et al., *Proc. SPIE*, 2724:334, 1996, Protecting Groups for 193–nm Photoresists.
Allen et al., *SPIE*, 2438:474–485, 1995; 193 nm Single Layer Positive Resists Building Etch Resistance Into a High Resolution Imaging System.
Breuing, *Makromol. Chem.* 193:2915–2927, 1992; Transition–metal–catalyzed vinyl addition polymerizations of norbornene derivatives with ester groups.
Choi et al., *SPIE*, 3049:104–111, 1997; Novel Single–Layer Chemically Amplified Resist for 193–nm Lithography.
Crivello et al., *Chem. Mater.* 8:376–381, 1996; Chemically Amplified Electron–Beam Photoresists.

Gokan et al., *J. Electrochem. Soc.: Sol.–State Sci. Technol.*, 130:143, 1983, Dry Etch Resistance of Organic Materials.
Graham et al., *Journal of Polymer Science* 61, 172:4659–4662, with appendix, 1960, Transannular Polymerization of 2–Carbethoxybicyclo[2.2.1]–2,5–heptadiene.
Haselwander et al., *Macromol. Chem. Phys.* 197, 3435–3453, 1996; Polynorbornene: synthesis, properties and simulations.
Kunz et al., *Proc. SPIE*, 1925:167–175, 1993; Acid–catalyzed single–layer resists for ArF lithography.
Kunz et al., *Proc. SPIE*, 2724: 365, 1996, Limits to Etch Resistance for 193–nm Single–Layer Resists.
MacDonald et al., *American Chemical Society, Accounts of Chemical Research*, 27:6, 151–158, Jun. 1994; Chemical Amplification in High–Resolution Imaging Systems.
Mathew et al., *Macromolecules* 29:2755–2763, 1996, ($\eta^3$–Allyl)palladium(II) and Palladium(II) Nitrile Catalysts for the Addition Polymerization of Norbornene Derivatives with Functional Groups.
Mühlebach et al., *American Chemical Society* 28:364–381, 1994, Advanced Materials and Forms: Photosensitive Metathesis Polymers.
Nishikubo et al., *American Chemical Society* 24:360–361, 1994, New Photoresponsive Polymers Bearing Norbornadiene Moiety.
Okoroanyanwu et al., *SPIE*, 1997, Single Layer Positive Photoresists for 193 nm Photolithography.
Schenker et al., *J. Vac. Sci.*, Nov./Dec.:3275, 1994, Deep–ultraviolet damage to fused silica.
Schenker et al., *Proc. SPIE*, 2440:118, 1995 Degradation of fused silica at 193–nm and 213–nm.y677.
Schenker et al., *Proc. SPIE*, 2726:698, 1996, Material Limitations to 193–nm Lithographic System Lifetimes.
Wallow et al., *SPIE*, 2724:355, 1996; Evaluation of Cycloolefin–Maleic Anhydride Alternating Copolymers as Single–Layer Photoresists for 193 nm Photolithography (Abstract).
Zenkl, *American Chemical Society* 25:371–375, 1994, Photoinitiated Thermolysis of Poly(5–norbornene 2,3–dicarboxylates.

*Primary Examiner*—Janet Baxter
*Assistant Examiner*—Rosemary Ashton
*Attorney, Agent, or Firm*—Townsend & Townsend & Crew

[57] ABSTRACT

Provided herein are photoresist compositions for use particularly in 193 nm lithography. These compositions generally comprise a polymer of norbornene and a photo acid generator. The disclosed compositions provide transparency at wavelengths of approximately 190–200 nm, combined with high etch resistance. The polymers also provide hydrophilicity for good positive-tone development characteristics and high glass transition temperatures. Also disclosed is a process for microfabrication utilizing the claimed compositions. A further aspect of the invention is a plasticizer comprising 4,8-di-t-butyl-tricyclo$(5.2.1.0^{2,6})$ decanedicarboxylate.

4 Claims, 8 Drawing Sheets

PHOTORESIST COMPOSITIONS COMPRISING NORBORNENE DERIVATIVE POLYMERS WITH ACID LABILE GROUPS

BACKGROUND OF THE INVENTION

1. Field of the Invention

The present invention relates generally to the fields of photoresist materials and polymer chemistry. More particularly, it concerns the production of photoresist compositions comprising polymers or co-polymers of norbornene or norbornene derivatives having acid labile groups pendant from the cyclic moieties which form a portion of the polymer backbone.

2. Description of Related Art

The use of photoresists is very important to the microfabrication of integrated circuits. The general sequence of events for resist processing includes (i) substrate preparation involving the degreasing and drying of the surface, such as a silicon chip, and perhaps the precoating with an adhesion promoter; (ii) photoresist coating which may be carried out by a wide variety of ways including spin coating on a fast-rotating turntable or spinner; (iii) prebake to remove traces of the coating solvent and release mechanical strains in the coated films; (iv) exposure with irradiation of the appropriate wavelength; (v) postexposure bake to activate the protecting groups (this step is not necessary for some photoresists, but is typically necessary for positive photoresists employing acidic photo-initiators; (vi) development which results in the removal of the unexposed or exposed photoresist for negative or positive photoresists, respectively; (vii) postbake to remove traces of the developer and anneal the polymer pattern; (viii) etching, metal patterning, or other manufacturing process; and (ix) stripping the photoresist from the surface of the substrate.

Most integrated circuits that are produced today are printed with I-line (365 nm) exposure technology. The latest generations of integrated circuits are being printed in the deep UV region (248 nm). The resolution that will be necessary for the manufacturing of future generations of integrated circuits is beyond the limits of the I-line and current deep UV lithography. For example, I-line technology has a resolution of only approximately 0.5 microns and 248 nm photoresists generally having a resolution of about 0.25 microns, where resolution refers to the ability to distinguish two neighboring elements of a pattern.

One of the approaches to enhanced imaging resolution is to decrease the wavelength of the irradiation source. According to The Semiconductor Industry Association's Technology Roadmap for Semiconductors, 193 nm lithography may be a promising candidate for achieving the desired high resolution. This approach is based on the known relationship between the resolution and the wavelength of the exposing irradiation. The minimum linewidth capable of being imaged by an optical element is proportional to the wavelength of the radiation used and inversely proportional to the numerical aperture of the optics with the proportionality constant depending on the sensitivity of the photoresist material, among other things. This relationship also suggests that increased resolution may be accomplished by increasing the numerical aperture of the optics. However, there are considerable technical problems and manufacturing expenses associated with such lenses. Additionally, the decrease in the numerical aperture adversely affects the depth of focus, which is important in high resolution lithography and depends inversely on the square of the numerical aperture.

Unfortunately, the implementation of 193 nm lithography has proven to be a major technological challenge. Even the best previously known lens materials absorb significantly at this wavelength. Although excellent 193 nm lens systems have been constructed, the damage threshold for the glass limits the exposure power that can be delivered to the wafer (Schenker et al. 1996; Schenker et al. 1994; Schenker et al 1995). Hence, the development of very high sensitivity resists is necessary to enable 193 nm imaging technology.

Photoresist materials designed for 193 nm exposure must have not only very high sensitivity, but must also be essentially transparent at the exposure wavelength and stable to reactive ion etching conditions. Unfortunately, the requirements of transparency at 193 nm and etch resistance have been generally considered to be mutually exclusive. If the photoresist is not sufficiently etch resistant then the portion of the substrate coated with the photoresist will not be protected and will be etched away as is the uncoated portion. It is known that high C/H ratio governs the sufficiency of etch resistance (Gokan et al. 1983). Additionally, conventional wisdom has held that aromaticity would provide the requisite C/H ratio since aromaticity combines double-bonds with ring structure, eliminating a significant number of hydrogen atoms from the molecule. In fact, aromatic compounds have proven quite useful in resist formulations for use with deep UV and I-line radiation.

Unfortunately, aromatics are generally known to be very strongly absorbing in the spectral region near 190 nm due to their allowed $\pi-\pi^*$ transitions in that region. Consequently, it has been shown that the phenolic resins typically used for I-line and deep UV (248-nm) photoresists, novolac and polyhydroxystyrene, respectively, are far too opaque at 193 nm to be used in formulating single-layer resist for use at that wavelength. Therefore, there is a strong need for photoresist compositions which are transparent in the spectral region near 193 nm and which provide adequate etch resistance.

Co-polymers of esters of methyl acrylate, methyl methacrylate, t-butyl acrylate, and acrylic acid, provide good imaging properties at 193 nm, but with very poor dry etch-resistance (Kunz et al. 1993; Allen et al. 1993; Kunz et al. 1996). Attempts to improve the dry etch resistance by the incorporation of pendant cycloaliphatic groups (Allen et al. 1996a; Allen et al. 1996b) have met with some success. However, Allen et al. have found that the increase in etch resistance resulting from the incorporation of cycloaliphatic groups comes at the expense of adequate imaging. The acrylate backbone, which serves to tether these cycloaliphatic groups, is known to depolymerize during reactive ion etching and ion-implantation. It is this depolymerization in response to exposure to radiation that is the basis for the positive tone function of poly(methyl methacrylate) resists.

Until the development of the present invention, a photoresist which possesses both the required transparency at 193 nm and an etch resistance equal to or greater than that of current I-line photoresists has not been known.

SUMMARY OF THE INVENTION

The present invention encompasses photoresist compositions and processes for using these photoresist compositions for the microfabrication of integrated circuits. The photoresist compositions of the present invention overcome the problems inherent in this area by providing transparency at 193 nm combined with exceptional etch resistance. Prior to the development of the present invention, it was generally believed that transparency at 193 nm and excellent etch resistance were mutually exclusive properties. The photoresist compositions of the present invention and processes for their use also provide excellent resolution. For example, it had been generally believed that the use of 193 nm photoresists might allow for a resolution of 0.18 µm or better. Resolutions of 0.16 µm are easily achieved with the processes and photoresist compositions of this invention.

The present invention encompasses photoresist compositions comprising a polymer of a t-butyl ester of a norbornene analog and a photo acid generator (PAG), or photo-initiator that generates acid upon irradiation. As used herein "norbornene analog" refers to norbornene and 7-oxa-norbornene and other functionalized compounds having these ring structures. For example, a t-butyl ester of a norbornene analog refers to butyl ester of norbornene carboxylic acid and t-butyl ester of 7-oxa-norbornene carboxylic acid. More specifically, the photoresist compositions of the present invention encompass polymers of t-butyl esters of norbornene carboxylic acid and 7-oxa-norbornene carboxylic acid. The terms "t-butyl ester of norbornene carboxylic acid" and "t-butyl ester of 7-oxa-norbornene carboxylic acid" is used to refer to norbornene and 7-oxa-norbornene molecules containing the group carbo-tert-butoxy. Thus, carbo-tert-butoxynorbornene derived polymers, such as those depicted in Scheme 4, are within the scope of the present invention.

As used herein, the term "polymer" refers to homopolymers and co-polymers. "Homo-polymers" refer to polymers derived from a single monomer, or having repeating units derived from a single monomer compound, while "co-polymers" refer to polymers derived from more than one type of monomer, or having repeating units derived from more than one monomer compound. Thus, for example, co-polymers of the present invention may include ter-polymers, tetra-polymers and so on. More specifically, some co-polymers of this invention include co-polymers comprised of at least two different repeating units, derived from at least two monomer compounds. A first repeating unit is derived from a monomer compound selected from the group consisting of a t-butyl ester of norbornene carboxylic acid or a t-butyl ester of 7-oxa-norbornene carboxylic acid, and a second repeating unit is derived from a monomer compound selected from the group consisting of maleic anhydride, norbornene carboxylic acid, 7-oxa-norbornene carboxylic acid, or methyltetracyclododecene carboxylic acid as well as any other monomer which can be successfully co-polymerized with these norbornene- and and 7-oxa-norbornene derivatives.

Co-polymers, as opposed to homo-poymers, of t-butyl esters of norbornene carboxylic acid and 7-oxa-norbornene carboxylic acid may be employed to improve the dissolution properties of the homopolymers derived from these compounds. The co-polymers often exhibit greater resistance to cracking in the predevelopment, development, and postexposure baking stages of microfabrication processes. The films of these homopolymers also tend to exhibit less uniformity than many of the co-polymers. Addition of other repeating units, particularly those containing acidic moieties, also improve the adhesion properties of the photoresists in the prebake and postexposure bake stages. The mole percent of co-monomer (i.e. not the monomer containing the t-butyl ester or other acid cleavable group) is generally from about 15% to about 25%, with about 20% being preferred. The mole percent for ring opening metathesis (ROMP) co-polymers containing methyltetracyclododecene carboxylic acid is generally about 15% methyltetracyclododecene carboxylic acid. Co-polymers containing maleic anhydride may comprise as much as 30% to 70% maleic anhydride (MAH). Maleic anhydride is generally a preferred co-monomer in the free radical polymerizations because such polymers do not generally require any plasticizers to achieve very high resolution photoresists.

The "repeating unit" is derived from the monomer in that the monomer is polymerized to form a polymer chain of repeating units, where the repeating unit and monomer may be structurally related but not necessarily identical to the monomer. However, because the specific polymerization reactions used to form the various polymers and co-polymers of this invention add the monomers in different ways, there may be several different repeating units derived from the same monomer. (See Scheme 4). To the extent, that the polymerization of one monomer results in a polymer structure with differing repeating units all derived from that same monomer, all such polymers are considered to be polymers comprising repeating units derived from that monomer and are encompassed by the present invention. Thus, the polymers depicted in Scheme 4 are all polymers having repeating units derived from a functionalized norbornene.

The photo acid generators (or photo-initiators) of the present invention may be any substances which produce a strong acid upon exposure to radiation. The use of such compounds are well known to those of skill in the art. (See, for example, Thompson et al. 1990, p.217). Under some circumstances, it may be preferable to employ a photo-initiator that is transparency at 193 nm. However, given the small concentration of photo-initiator generally present in the photoresist composition, photo-initiators which contain moieties that absorb radiation in that region (aromatic groups, for example) are also operable in the present invention. Preferred photo-initiators for use in conjunction with the present invention include, but are not limited to diazo ketones and esters of polyhydroxyaromatics and salts wherein the cationic species is an aryl diazonium, a diaryliodonium, a trialkylsulfonium, and a triarylsulfonium cation. Various anion may be employed as counterions for the photoinitiators. Preferred anions include, but are not limited to, tetraflouroborate, hexafluoroantimonate, hexafluoroarsenate, hexafluorophosphate, and triflate. Some of the salts (and the products of deprotection by acid) that are envisioned as being useful in this invention are depicted below:

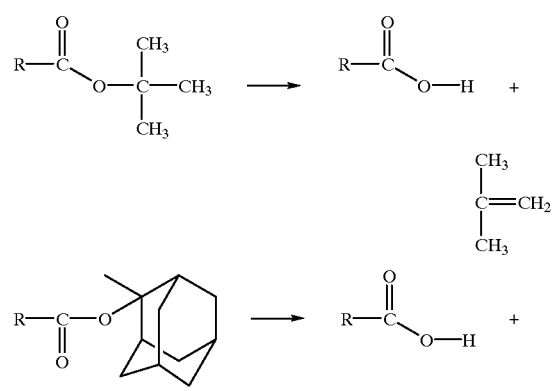

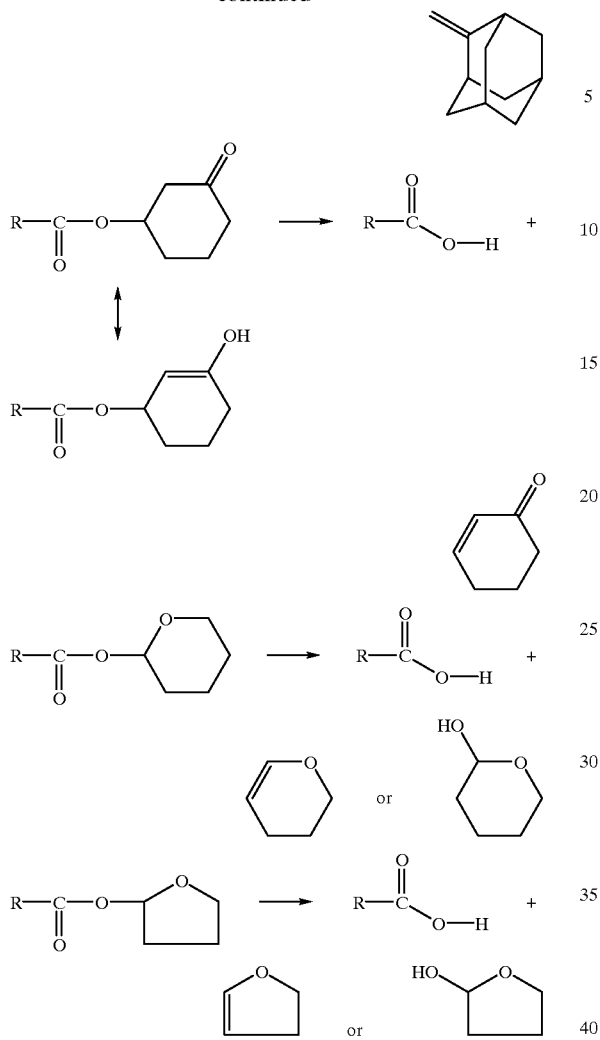

A particularly preferred photo-initiator is triphenylsulfonium hexafluoroantimonate, which is easily synthesized. Although a broad range of concentrations for the photo-initiator may be employed, preferred photoresist compositions have from about 0.5% to about 5% by weight triphenylsulfonium hexafluoroantimonate, with from about 1% or about 2% to about 3% by weight being more particularly preferred. Higher concentrations of photo-initiator are also operable. For example, as much as about 10% by weight may be operable with some photoresist compositions of this invention. However, it is generally preferred to work with lower concentrations of photo-initiator present.

It is preferable to make the compositions sensitive to various wavelengths of light, particularly to radiation with a wavelength of from about 190 nm to about 200 nm and most particularly to light of wavelength of 193 nm. This is accomplished by matching the absorption maxima of the photo-initiator to the appropriate wavelength by substitution of the aryl substituents of the salts, which is well known in the art.

The photoresist compositions of this invention may also contain plasticizers to increase the plasticity or flexibility of the photoresist compositions. Plasticizers will be most commonly employed to ease problems associated with brittleness of the photoresist. Preferred plasticizers include, but are not limited to, cholesteric ester derivatives and di-tert-butyl esters of polycyclic di-carboxylic acids, particularly 4,8-Di-t-butyl-tricyclo(5.2.1.0$^{2,6}$)decanedicarboxylate which is depicted in Scheme 6. The identify and function of the plasticizer depends upon the nature of the polymer or co-polymer employed.

In other embodiments this invention encompasses a photoresist composition comprising a polymer or co-polymer of norbornene having an acid cleavable group pendant from the polymer backbone, and a photo-initiator which generates acid upon irradiation. Acid cleavable groups are groups which are labile in acid to form a polar product that is soluble in polar media. Preferred acid cleavable groups for use in conjunction with the present invention do not have aromatic rings because aromatic groups tend to absorb in the range of 190–200 nm and decrease the transparency of the photoresist compositions in that region. Although a wide range of acid cleavable groups are known in the art (see U.S. Pat. No. 4,491,628), preferred acid cleavable groups include t-butyl ester, isobornyl ester, tetrahydropyranyl ester and tetrahydrofuranyl ester, and other analogous groups depicted below:

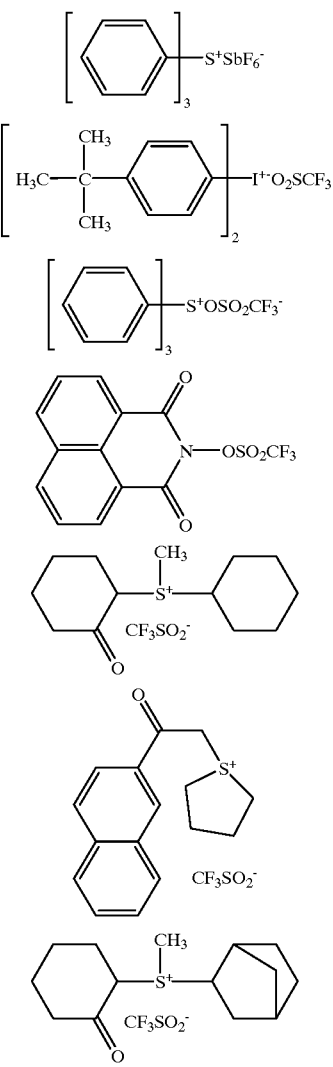

-continued

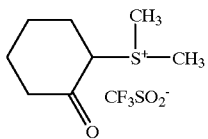

Preferred embodiments of the photoresist compositions of the present invention may also be transparent at 193 nm and characterized by an etch resistance of from about 0.15 to about 1.2, with from about 0.25 to about 1.1 being particularly preferred. These etch resistances refer to etching under agressive ion etching conditions employing chlorine, which are well known in the art, standardized such that 1 is the etch resistance of Apex E poly(4-t-butoxycarbonyloxystyrene), an intrisically etch resistant 248 nm photoresist. (See Table 5). Thus, an etch resistance of 1.2 would indicate that a given photoresist has a rate of etching under aggressive ion etching conditions of 1.2 times the rate of etching for Apex E. The polymers or co-polymers of the photoresist compositions generally have glass transition temperatures of from about 85° C. to greater than 250° C., with from 120° C. to about 170° C. being particularly preferred.

As used herein "transparent" means sufficiently transparent such that the radiation is able to activate the photo acid generator present in the photoresist composition that is exposed to radiation of a particular wavelength.

It is contemplated that the polymer or co-polymer of the present invention may be formed by a wide variety of polymerization reactions, such as vinyl addition polymerizations, free radical polymerizations and ring opening metathesis polymerizations. The photoresists formed by these various methods have varying properties. Although a wide variety of polymerization reactions employing a wide variety of conditions and catalysts are within the scope of the present invention, preferred embodiments include vinyl addition polymerizations which are carried out in the presence of bis-tetrafluoroboratetetrakis(cyanomethane) palladium; free radical polymerizations which are carried out in the presence of di-tert-butyl peroxide, azobisisobutyronitrile (AIBN), and benzoyl peroxide; and ring opening metathesis polymerizations which are carried out in the presence of dipotassium hexachloroiridate and other catalysts well known in the art. Although these catalysts and initiators are presently preferred for practising this invention, one of skill in the art would readily be able to modify these catalysts and initiators in the various polymerization reactions. For example, there are numerous polymerization initiators, Pd(II) vinyl addition polymerization catalysts, and ROMP catalysts that are well known in the art. Additionally, one of skill in the art could modify the metal center or ligands of the catalyst and produce photoresists operable in and encompassed by this invention.

As used herein "free radical polymers," "vinyl addition polymers" and "ROMP polymers" refer to polymers formed by free radical polymerizations, vinyl addition polymerizations, and ROMP polymerizations, respectively.

Although the invention is operable with the metal catalyst present, under many circumstances it may be preferable to remove the catalyst. For example, removing the catalyst may result in an increase in the transparency of the photoresist at 193 nm because the metal center and its aromatic ligands possess allowed transitions in that region with the metal centers often being highly absorptive. Additionally, if the photoresists are to be used in the semiconductor industry, it is necessary to remove the metal. The semiconductor industry generally requires parts per billion of metal in their photoresists because the metal may damage the device being microfabricated. Metal presence in the photoresist may also cause adhesion problems. The removal of metal generally may be accomplished by slowly bubbling hydrogen through a dilute solution of the polymer for several hours until the metal precipitates out of the solution.

Photoresist compositions formed by ring opening metathesis polymerizations may also be hydrogenated by many techniques known in the art. Several illustrative examples of hydrogenation reactions are given in the Detailed Description.

Photoresist co-polymers encompassed by the present invention may include at least two repeating units, a first repeating unit derived from a monomer compound selected from the group consisting of a t-butyl ester of norbornene carboxylic acid or a t-butyl ester of 7-oxa-norbornene carboxylic acid, and a second repeating unit derived from a monomer compound selected from the group consisting of, for example, maleic anhydride, norbornene carboxylic acid, 7-oxa-norbornene carboxylic acid, or methyltetracyclododecene carboxylic acid.

Another aspect of the present invention includes a process for microfabrication comprising exposing a substrate coated with a photoresist composition to irradiation of wavelength from below about 200 nm, dissolving the irradiated photoresist in a basic medium, heating the substrate, and etching the substrate, wherein the photoresist composition is stable to reactive ion etching.

The photoresist composition may be irradiated with light from any source at any wavelength where the photoresist is sufficiently transparent for the radiation to activate the photo acid generator throughout of the photoresist that was exposed to the radiation. It is envisioned that wavelengths of from about 170 nm to about 200 nm will be generally preferable, with wavelengths of from about 190 nm to about 200 nm being more preferable.

Although it is contemplated that the photoresists of this invention will be most useful with irradiation sources emitting light of 193 nm, the processes encompassed by this invention are operable over a broad range of wavelengths including longer wavelengths, such as 248 nm. This invention is also not limited to light of wavelength 193 nm. This wavelength is particularly preferred because ArF excimers emit light of this wavelength but as other emitter sources become available, it is contemplated that the photoresist compositions and processes for their use will be able to operate satisfactorily at these other wavelengths as well.

As used herein the term "substrate" refers to the material that will form the microfabricated part, such as galium arsenide, ceramics or metal. These components are well known by those of skill in the art. The most preferred substrate is silicon.

The developing media for use in the microfabricating processes of this inventions should generally be basic media. Because the primary application of this process is in the manufacture of integrated circuits for the semiconductor industry, metal-free organic bases are generally preferred. Therefore, bases, such as NaOH and KOH, while operable, would not be preferred for these types of applications. Thus, organic water-soluble bases are generally preferred. A particularly preferred medium for development comprises about 0.26N tetramethylammonium hydroxide, although this may be diluted depending upon the individual photoresist used.

Etching is well known in the art. Generally, etching processes can be divided into dry and wet etching processes.

Wet etching processes generally do not exhibit very good resolutions. Therefore, even though they are operable with the present invention, they are not preferable. Dry etching processes, such as plasma etching and reactive ion etching, exhibit much higher resolutions and, thus, are preferable for practicing the present invention. The most aggressive etching processes tend to employ chlorine or chlorine in combination with other components, such as HBr or Ar. The photoresists described in this inventions exhibit excellent etch resistance to chlorine etching, as opposed to most other 193 nm photoresists, that are only resistant to plasma etching with Ar, $CF_4$ or HBr or ion etching with $O_2$.

The substrate may need to be heated after exposure to irradiation to cause the deprotection reaction to occur. Generally, the substrate should be heated to temperatures from about 120° C. to about 250° C., with from about 120° C. to about 170° C. being preferred and from about 130° C. to about 150° C. being particularly preferred.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

The intensity of the carboxylic acid OH stretch (3100–3600 cm$^{-1}$) and the carboxylic acid carbonyl (C=O) stretch (1695–1705 cm$^{-1}$) both increase, while the ester carbonyl (C=O) stretch (ca. 1720 cm$^{-1}$) decreases, with increasing dose of exposure (0 to 50 mJ/cm$^2$), indicating the deprotection of the t-butyl ester group and the consequent conversion to a carboxylic acid. The C—O—C (1150 cm$^{-1}$) stretch of the ester also decreases with exposure dose.

Figure 6:
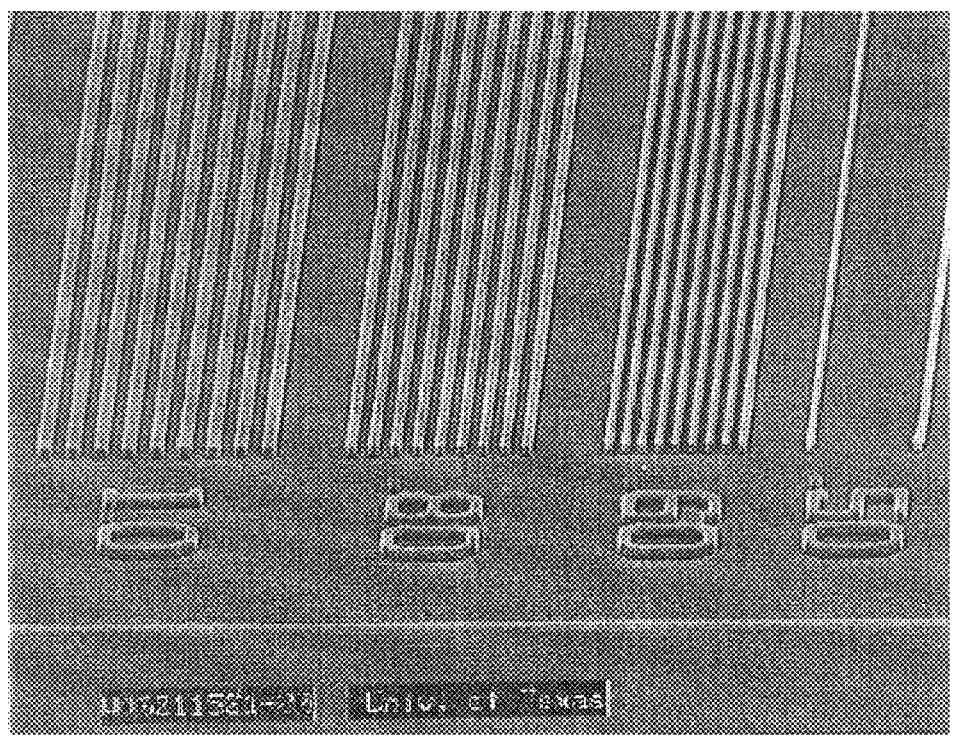

FIG. 6. Scanning electron micrograph image of 0.4–1.0 µm lines and spaces printed in resist formulated with poly(CBN-co-NBCA) made by vinyl addition polymerization.

Figure 7:
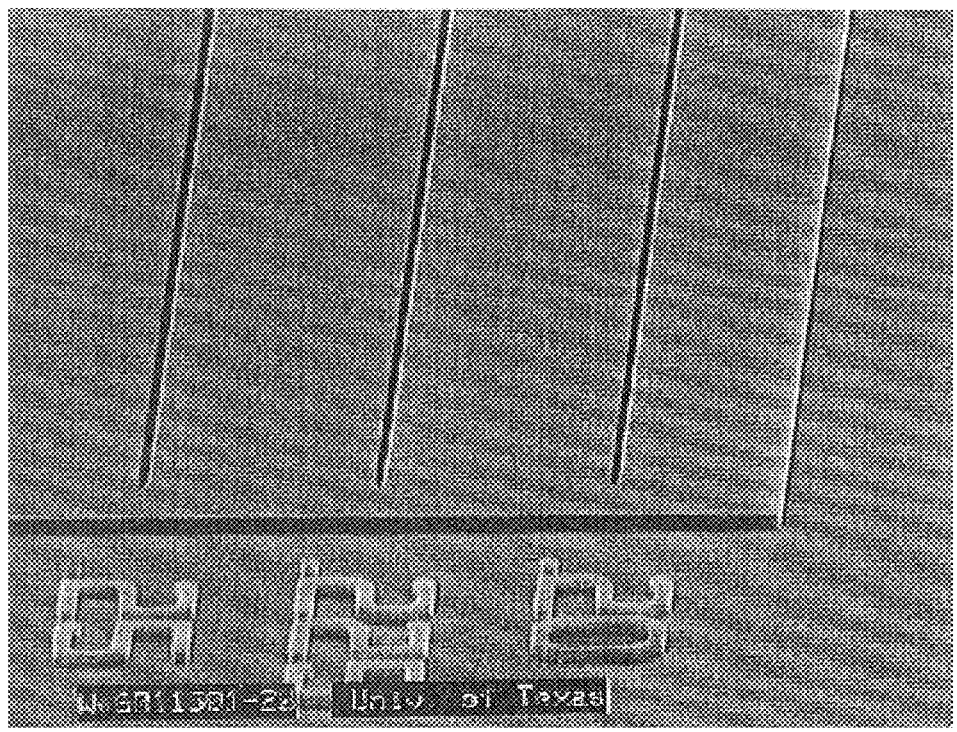

FIG. 7. Scanning electron micrograph image of 0.2, 0.225, and 0.25 µm trenches printed in resist formulated with poly(CBN-co-NBCA) made by vinyl addition copolymer. Similar images were printed with resist formulated with poly(CBN-co-NBCA) made by free radical polymerization.

Figure 8:
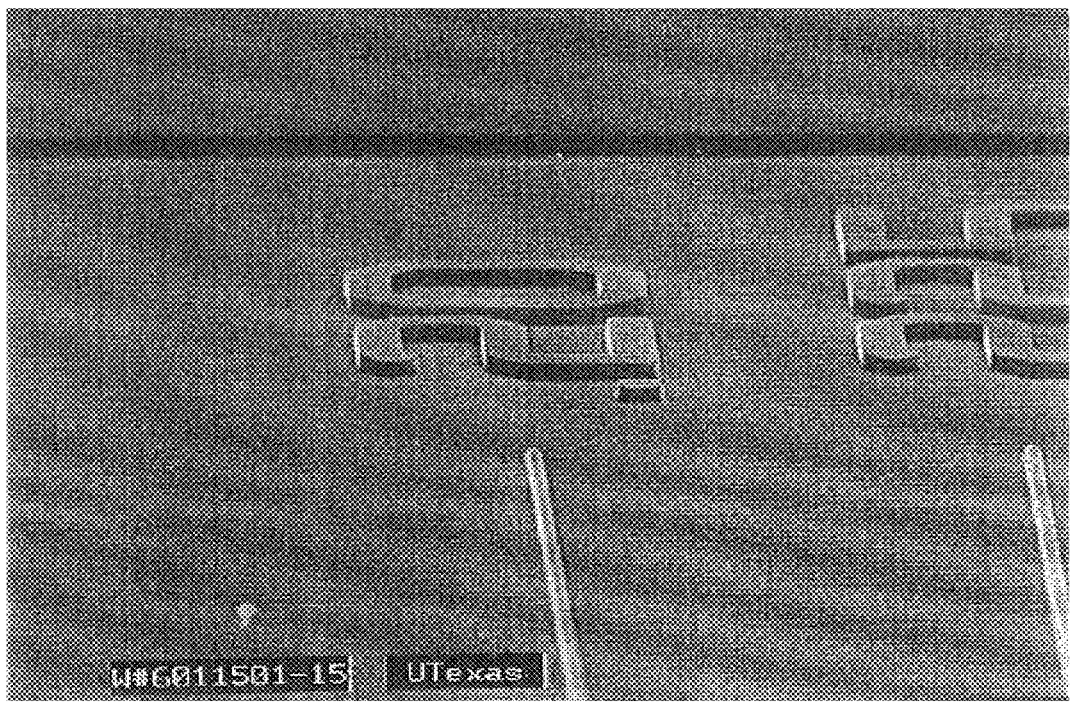

FIG. 8. Scanning electron micrograph image of 0.2 and 0.25 µm isolated lines printed with resist formulated with poly(CBN-co-MTDCA) made by ROMP.

Figure 9:
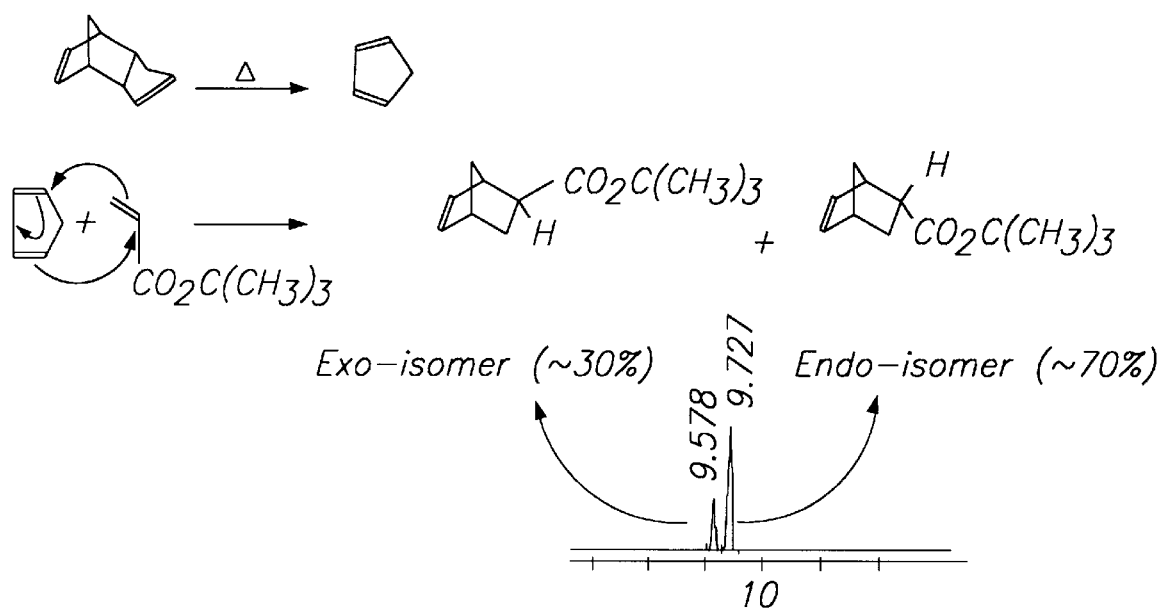

FIG. 9. Synthesis of CBN (endo/exo ratio 70/30) via by Diels-Alder reaction between cyclopentadiene and tert-butyl acrylate and the chromatogram showing the resolved isomers also illustrates the relative ratio of exo/endo isomers (exo:endo~30/70%).

Figure 10:
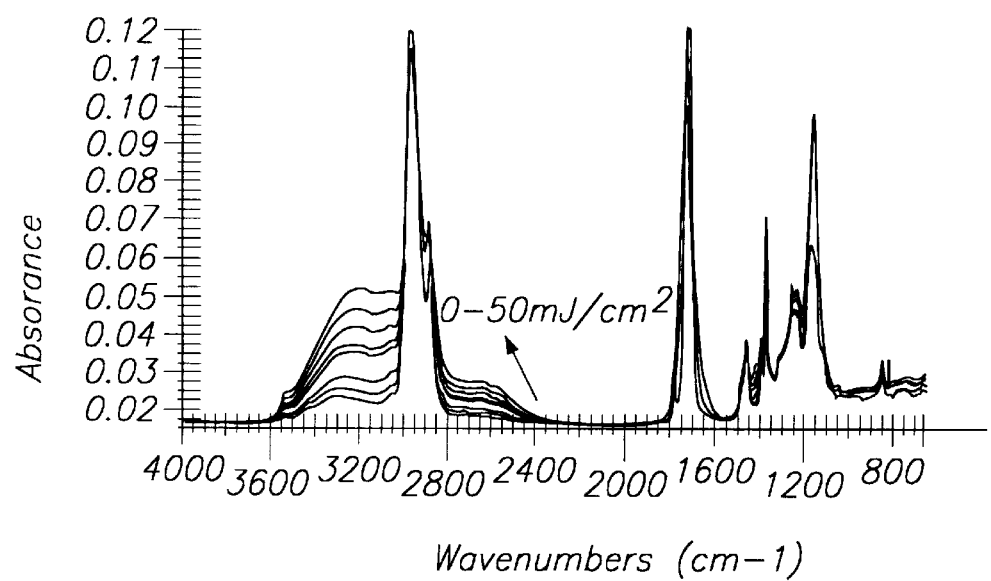

FIG. 10. Change in FTIR Spectra of photoresist as a function of dose. Post—exposure bake temperature=130° C., time=60 seconds.

Figure 11:
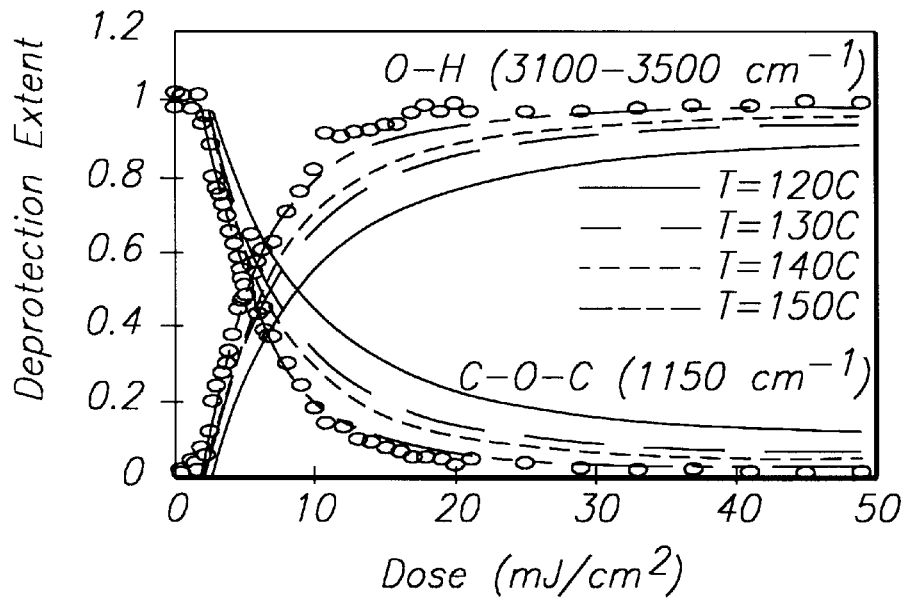

FIG. 11. The carboxylic OH and carbonyl C=O profile upon irradiation of resist. The circles (○) in FIG. 11 represent experimental values obtained at 150° C., while the lines represent the values predicted by the model at baking temperatures of 120° C., 130° C., 140° C. and 150° C. The experimental values obtained at 120° C., 130° C. and 140° C. are not shown in this figure for the sake of clarity.

Figure 12:
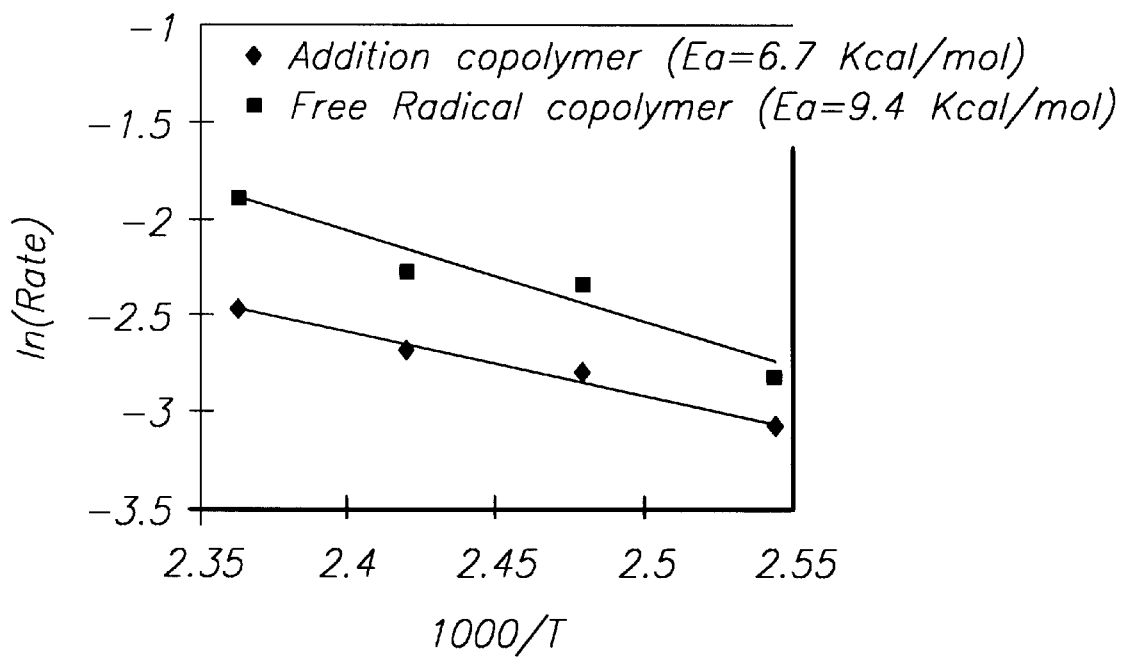

FIG. 12. Arrhenius plot for different resist types.

Figure 13:
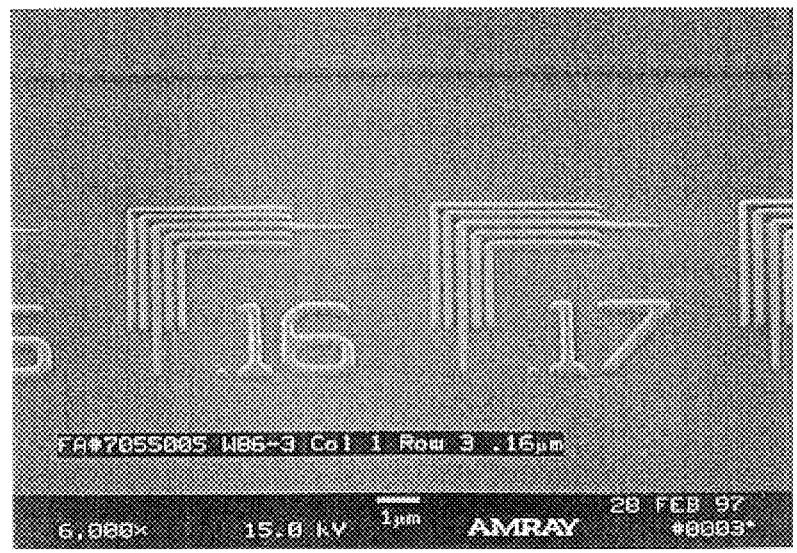

FIG. 13. Scanning electron micrograph image of 0.16 and 0.17 µm features obtained from resist formulated with poly(CBN-co-MAH). Note the excellent adhesion demonstrated by the resolution of the small decimal point in front of the numbers.

Figure 14:
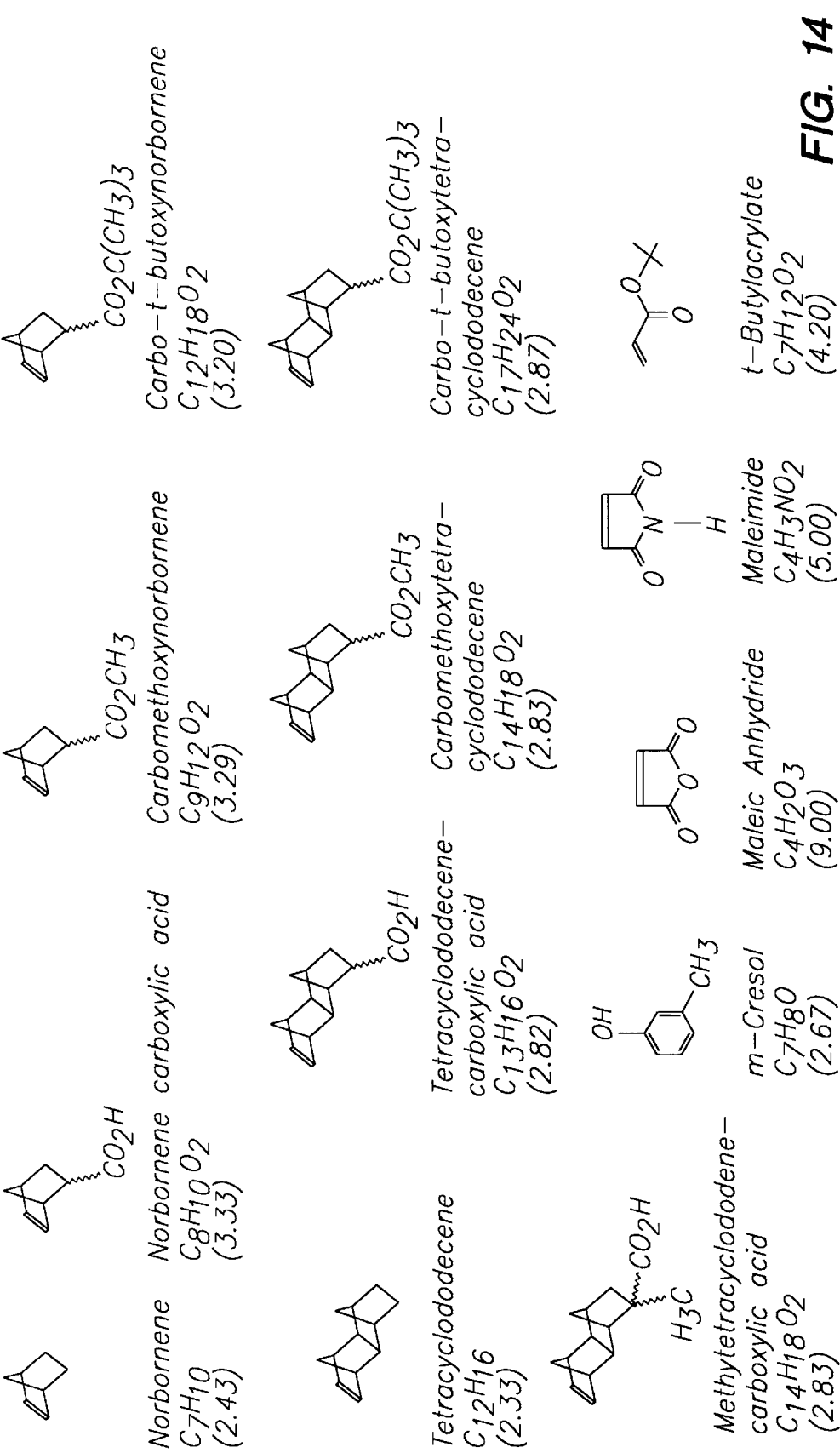

FIG. 14. Ohnishi Parameter values for various monomers.

DESCRIPTION OF ILLUSTRATIVE EMBODIMENTS

The present invention provides a series of new, single layer, chemically amplified, positive photoresists for 193 nm lithography comprising polymers or co-polymers of norbornene. As used herein, "norbornene" encompasses norbornene, derivatives of norbornene and analogs of norbornene. The term "co-polymer" as used herein encompasses all polymers incorporating more than one different repeating unit.

The resist formulations of the present invention exhibit transparency at 193 nm while at the same time providing etch resistance comparable to, or better than, the novolac and poly(p-hydroxystyrene) based results obtained with I-line and deep UV radiation. It is known that etch resistance demands a high C/H ratio in the empirical formula (Gokan et al. 1983). This high C/H ratio has typically been achieved by incorporating aromatics. However, aromatic compounds are generally unsuitable for use in 193 nm lithography due to the allowed π–π* transitions which cause the aromatic compounds to absorb light at this wavelength. Therefore, for use in conjunction with 193 nm radiation, an adequately high C/H ratio may be achieved only by inclusion of isolated double bonds and fused cycloaliphatic structures into the polymer backbone. Remarkably, the photoresists of the present invention are even more etch resistant than one in the art would predict based on its C/H ratio.

It was originally determined that photoresist compositions for 193 nm lithography should possess similar properties to the hydroxystyrene polymers which are popular resist materials for use with deep UV radiation. That is, preferred 193 nm resists possess hydrophilicity for good positive-tone development characteristics; high glass transition temperatures (Tg—130–170° C.) for good thermal properties and latitude to perform higher post-expose bakes; high C/H ratio for good etch resistance; and an easily blocked hydroxyl group for incorporation of an acid cleavable functionality.

A lower Tg may have adverse consequences for the use of photoresists in microfabrication because postbaking may cause such polymers to flow and round on the edges and result in decreased resolution in the post-etched product. Slight rounding may be tolerable in wet or aqueous etching, but not in dry etching which depends critically on obtaining a vertical resist profile.

The Tg of a composition also affects the prebake step in resist processing. While the decomposition temperature for any components of the photoresist composition determines the practical upper limit of the prebake, the Tg of the photoresist polymer is important to the lower limit as efficient solvent removal requires a prebake temperature above the Tg of the polymer. Baking a polymer above its Tg causes a shrinkage of its free volume, excluding solvent from its intermolecular voids, and above the Tg the solvent diffuses rapidly out of the film.

Methacrylate co-polymers which provide high resolution imaging and moderate etch resistance have been developed using free radical solution polymerization (Kunz et al. 1993; Allen et al. 1994). However, building a resist with excellent etch resistance combined with good imaging characteristics remains the challenge. Co-polymer resist formulations comprising methyl methacrylate (MMA), tert-butyl methacrylate (TBMA) and methacrylic acid (MAA) have been developed (Allen et al. 1994). Allen et al. produced a methacrylate polymer-based positive photoresist with excellent optical transparency, aqueous-development, high Tg, good adhesion and excellent imaging properties but which lacks the required etch resistance for most semiconductor processes.

Co-polymers comprising MMA, TBMA and MAA have been shown to exhibit etch properties similar to conventional deep UV resists in $CF_4$ based (oxide) etch recipes. However, more aggressive etch chemistries (e.g. aluminum and polysilicon etching) demand substantial increases in etch resistance. Alicyclic (aliphatic/cyclic) compounds, such as adamantyl, norbornyl, tricyclodecanyl and adamantanemethyl, were incorporated into the polymer structure as pendant groups to the polymer backbone in an attempt to improve etch resistance. Although the alicyclic methacrylate monomers provided sufficient etch-resistance (2–2.5 times faster than novolac for non-alicyclic methacrylate polymers to 1.2–1.4 times faster for a 50% copolymer of adamantane methylmethacrylate-co-methyl methacrylate (Allen et al. 1994)), the imaging performance was poor. Alicyclic incorporation also produced a strong increase in Tg, increased hydrophobicity, poor adhesion and embrittlement.

The inventors have produced polymers and co-polymers of norbornene which not only exhibit excellent imaging performance but also possess surprising and unexpected etch resistance at 193 nm. Etch resistance is typically predicted using the formula:

N/Nc–No where N is the total number of atoms, Nc the number of carbon atoms, and No the number of oxygen atoms per monomer. The measured etch resistance for polymers of norbornene are shown in Table 5. The resist compositions of the present invention exhibited surprising and unexpected etch resistance as compared to calculated values (see FIG. 14).

It has been known for some time that norbornene undergoes ring opening metathesis polymerization in the presence of Ziegler-Natta catalysts (U.S. Pat. No. 2,721,189; Truett et al. 1960; Sartori and Ciampelli 1963; Tsujino et al. 1965); reduced oxides of Cr, Mo and W (German Patent No. 1072811); and hydrated halides of Ru, Os, and Ir (Michelotti and Keaveney 1965; Rhinehart and Smith 1965), resulting in an unsaturated polymer, poly(1,3-cyclopentylenevinylene). Norbornene also undergoes cationic polymerization in the presence of $C_2H_5AlCl_2$ (Kennedy and Makwoski 1967), and free radical polymerization in the presence of di-tert-butyl peroxide (Gaylord et. al. 1976; Gaylord et al. 1977) to yield poly(2,7-bicyclo(2.2.1)hept-2-ene), a saturated polymer. Although the polymer derived from free radical initiation exhibited unusual 2,7-enchainment, the structure has been attributed it to skeletal structural rearrangements of the bicyclic monomeric unit that take place during the propagation reaction (Gaylord et. al. 1976; Gaylord et al. 1977). Norbornene also undergoes vinyl addition polymerization in the presence of compounds of Pd(II) (Risse and Breunig 1992; Mehler and Risse 1992; Schulz 1996; Tanielian et al. 1979; Sen and Lai 1982; Mehler and Risse 1991) and Ti(IV) (Sartori and Ciampelli 1963), resulting in poly(2,3-bicyclo (2.2.1)hept-2-ene, a saturated polymer with 2,3-enchainment. Risse and co-workers (Risse and Breunig 1992) have reported the Pd(II)-catalyzed vinyl addition polymerization of norbornene. They have also prepared vinyl addition polymers of norbornene derivatives containing ester functional groups, however, none of these polymers are suitable for use as photoresists because they do not react with a photo-initiator (Mathew et al. 1996.).

The inventors employed the above chemistries in the synthesis of cycloaliphatic polymers with pendant free carboxylic acid groups and carboxylic acids protected with acid-cleaveable groups, such as tert-butyl esters. Norbornyl derivatives, such as carbo-tert-butoxynorbornene (CBN) and anologs were polymerized by (1) vinyl addition polymerization (VAP) with bis-tetrafluoroboratetetrakis (cyanomethane)palladium (($Pd(CH_3CN)_4)(BF_4)_2$), in nitromethane at room temperature (see Scheme 1), (2) free radical polymerization (FRP) with di-tert-butyl peroxide (DTBP) at 118–130° C.; or AIBN at 65° C. in THF (see Scheme 2), and (3) ring opening metathesis polymerization (ROMP) with dipotassium hexachloroiridate ($K_2IrCl_6$) in a mixture of water, acetic acid and zinc at 50° C. (see Scheme 3). The ROMP polymers were then hydrogenated, using diimide, produced in situ from hydrazine (see Scheme 3).

Scheme 1

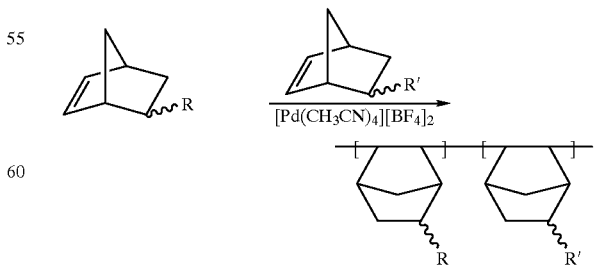

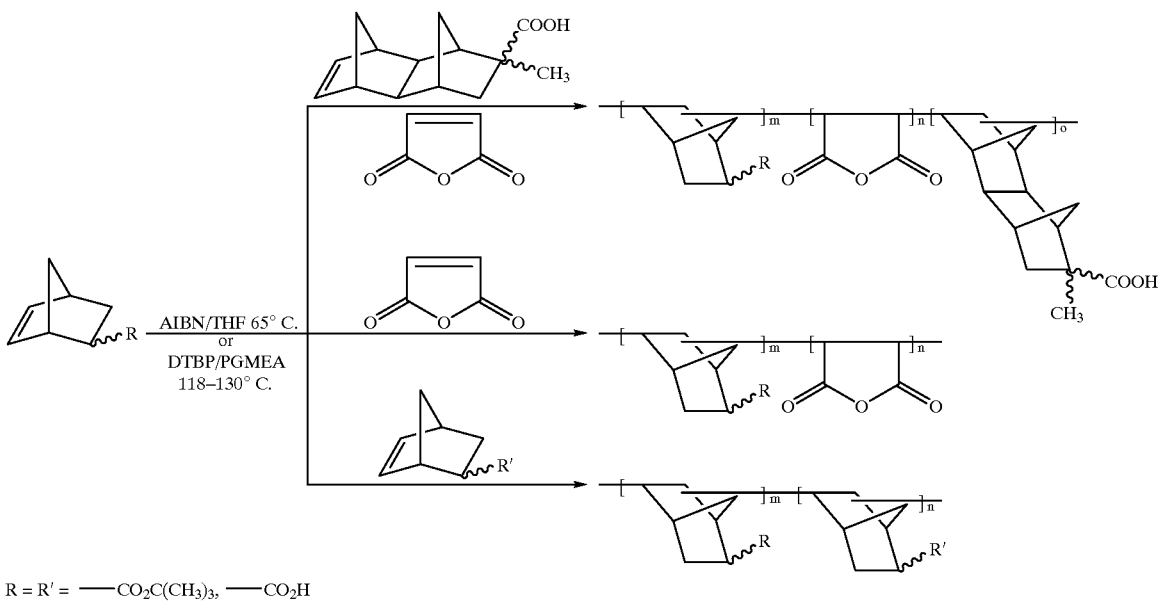

Scheme 2

R = R' = —CO₂C(CH₃)₃, —CO₂H

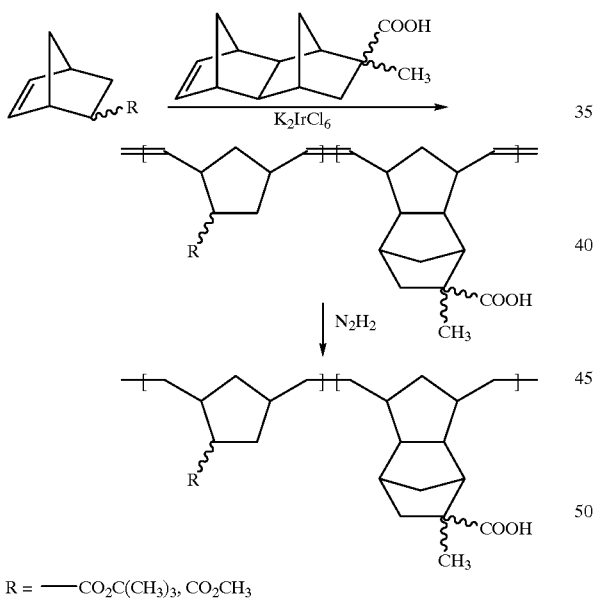

Scheme 3

R = —CO₂C(CH₃)₃, CO₂CH₃

Co-polymers of the present invention comprise monomer units of norbornene carboxylic acid esters and one or more different monomer units comprising maleic anhydride, norbornene carboxylic acid, 7-oxa-norbornene carboxylic acid, or methyltetracyclododecene carboxylic acid.

It is contemplated that resist formulations of the present invention may be synthesized by any means known in the art. For example, the resist formulations of the invention may be constituted from a series of cycloaliphatic polymers synthesized by free radical, vinyl addition and ring opening metathesis polymerization techniques as described above, although other synthesis techniques may be used. It is further contemplated that polymers derived from ring opening metathesis polymerization may be hydrogenated to provide yet another member of this group of materials. Scheme 4 shows the synthetic pathways to these polymers.

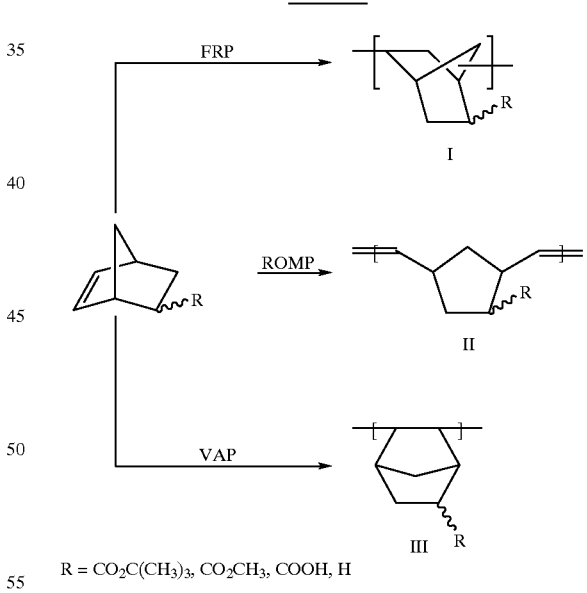

Scheme 4

R = CO₂C(CH₃)₃, CO₂CH₃, COOH, H

Free radical polymerization (FRP), ring opening metathesis polymerization (ROMP), and vinyl addition polymerization (VAP) techniques provide polymers which differ in their enchainment and physical properties. Polymers I, II, and III shown in Scheme 4 illustrate the enchainment differences occurring in polymerizations of norbornene or its derivatives. Co-polymerization of norbornene with other alicyclic monomers, such as maleic anhydride, maleimide, and methyltetracyclododecene carboxylic acid, are also encompassed by the present invention.

Figure 1:
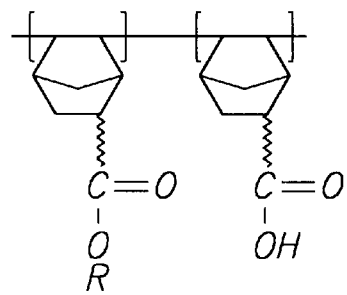
FIG. 1. Generic design of copolymers for 193 nm photolithography. These co-polymers comprise a cycloaliphatic backbone having pendant acid cleavable groups, such as tert-butyl ester. These co-polymers may also incorporate a carboxylic acid.

The generic design of the polymers of the invention is illustrated in FIG. 1. The cycloaliphatic backbone provides dry etch-resistance and thermal stability and serves to tether the pendant functionalities required for imaging. The resist compositions of the invention incorporate a pendant acid cleavable group, such as a tert-butyl ester, and a carboxylic acid, which enhances the adhesion, wetability and solubility of the material in aqueous base developing solvent. The acid labile functionality provides a mode of conversion from aqueous base insolubility to solubility, allowing portions of the resist from which the acid labile group has been cleaved by exposure to radiation to be washed away using a basic solution. Thus, the resist compositions of the invention incorporate the concept of chemical amplification (Willson et al. 1982; Ito and Willson 1982; Willson et al. 1986; Frechet et al. 1982)—a process that involves the photogeneration of species within the resist that catalyze subsequent chemical events that in turn modify the solubility of the polymer in aqueous base. In this way, the overall quantum efficiency of the reactions responsible for modifying solubility is greater than one. Thus, such systems have very high sensitivity. This concept has been exploited in the design of new resist systems, but has not been contemplated in connection with polymers and co-polymers of norbornene or norbornene derivatives until the development of the present invention.

Acid labile groups for use in the present invention include, but are not limited to, t-butyl ester, isobornyl ester, tetrahydropyranyl ester and tetrahydrofuranyl ester.

In general, the resist compositions of the present invention comprise a polymer or co-polymer, as described above, and a photo-initiator. It will be understood in the art that any substance which produces strong acid upon exposure to radiation can be a photo-initiator. However, the most preferred photo-initiators are unsubstituted and symmetrically or unsymmetrically substituted substituted diaryliodonium or triarylsulfonium salts. Triarylselenonium salts may also be useful. Substituted aryldiazonium salts can be employed as well. The most preferable gegenanions of the salts in the present invention are complex metal halides such as tetrafluoroborate, hexafluoroantimonate, hexafluoroarsenate and hexafluorophosphate. The invention is not limited to these gegenanions and photo-initiators. In certain preferred embodiments, the photoinitiator may be aryldiazonium, diaryldiazonium or triarylsulfonium metal halides. Preferably, the photo-initiator is a triarylsulfonium metal halide. More preferably, the photo-initiator is triphenylsulfonium hexafluoroantimonate.

The compositions of the invention are typically formulated by dissolving the polymer and photo-initiator in an appropriate solvent such as propylene glycol monomethylether acetate. Upon irradiation, the photo-initiator in the resist film generates a latent image of strong acid, which upon baking, catalyzes the thermolysis reaction of the t-butyl ester pendant group (see Scheme 5), leading to the formation of isobutylene and norbornene carboxylic acid which has a higher solubility in basic developing solvent than its masked analog. Development of the exposed and baked film in aqueous base generates positive tone images of the mask.

Scheme 5

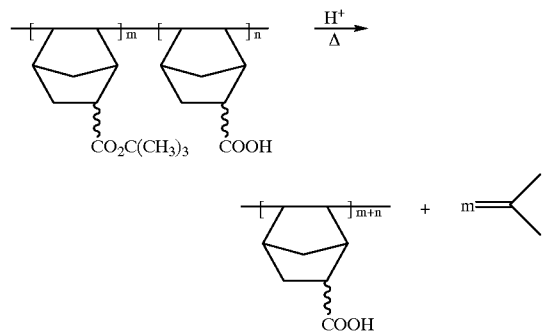

Homo- and co-polymers of cycloaliphatic monomers such as carbo-tert-butoxynorbornene (CBN), norbornene carboxylic acid (NBCA), methyltetracyclododecene carboxylic acid (MTDCA), maleic anhydride, and maleimide, are ideal for use as resist materials for 193 nm lithography because they are highly etch-resistant and rival acrylic-based polymers in transparency.

For high volume use in the semiconductor industry, where photoresist compositions are coated onto silicon wafers, it is necessary to remove the metal complexes and catalysts remaining on polymers prepared by vinyl addition polymerization technique so that the resist compositions are substantially metal-free. The residual palladium complexes and catalysts include the following: (1) $((RCN)_4Pd)(BF_4)_2$, where R is any alkyl group, for instance $CH_3$, $CH_3(DH_2)_2$, $C_6H_5$, etc., (2) $(\eta^3\text{-allyl})Pd(X)$, where X is $SbF_6$, $BF_4$, etc., and (3) other commonly used Pd(II) complexes used as catalysts in vinyl addition polymerization.

Although the metal may be removed by any of the techniques which are well known in the art, the preferred process involves making a 3–5 wt % solution of the polymer in tetrahydrofuran (THF), or any suitable solvent, and slowly bubbling hydrogen gas by means of a dispersion tube through the solution for 3–5 hours. The resulting dark precipitate eventually aggregates and settles on the bottom of the reaction vessel, and can be removed by filtration. Upon concentrating the filtrate, the polymer can be precipitated in any appropriate solvent, preferably acetonitrile, and dried in a vacuum oven.

This process for removing the residual palladium complexes and catalysts from the polymer is simple, cheap and removes the metal to an acceptable level. The polymer obtained is pure and is not altered in any way by the process. Detailed protocols for carrying out the metal-removal process may be found in the examples.

Synthesis of Plasticizing Additive

The resists formulated with vinyl and free radical polymers produced somewhat brittle films that had cracking problems. Plasticizers have been used successfully to improve resists with similar problems (Reichmanis et al. 1981; Reichmanis et al. 1983a; Reichmanis et al. 1983b; Reichmanis et al. 1987). A non-reactive, low melting, plasticizing agent made of cholesteric ester derivatives was therefore added to the resist formulation to overcome the problem of brittleness in the VAP and FRP polymers, while a high melting, reactive plasticizing additive, di-tert-butyl ester of a polycyclic alkyl di-carboxylic acid (4,8-Di-t-butyl-tricyclo(5.2.1.0$^{2,6}$)decanedicarboxylate), was used in the case of the ROMP and hydrogenated ROMP polymers whose Tg's were much lower than those of the VAP and FRP polymers.

A reactive plasticizing additive was used to overcome the problem of brittleness in films of the vinyl addition and free radical polymers. The di-t-butyl ester of a polycyclic alkyl di-carboxylic acid was synthesized as shown in Scheme 6. The ring system of the plasticizing additive as shown in Scheme 6 allows for a high C/H ratio, good etch resistance and provides a mixture of isomers which improves solubility. The low molecular mass, hydrophobic guest molecule has a plasticizing effect on the matrix polymer. The oxidation of the tricylcic aliphatic diol was achieved using $KMnO_4$ under phase transfer conditions. The resulting dicarboxylic acid was esterified with t-butanol using DCC/DMAP.

Scheme 6

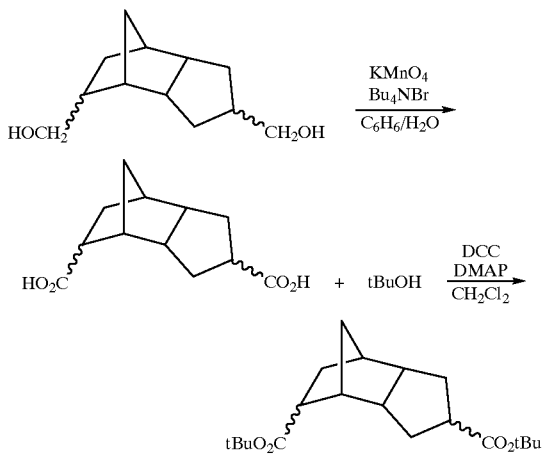

Figure 3:
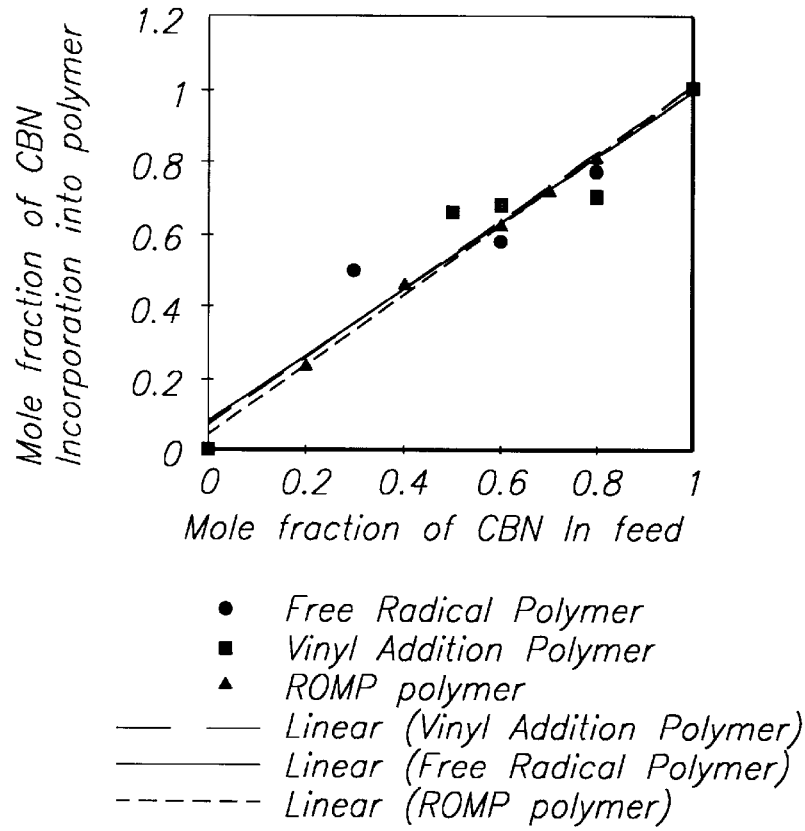
FIG. 3. Results of the incorporation of CBN into copolymers of poly(CBN-co-NBCA) for vinyl addition and free radical polymerization techniques, and into poly(CBN-co-MTDCA) for the ROMP techniques are shown. Irrespective of the polymerization technique, the incorporation of CBN into the copolymers appears to be linearly dependent on its mole fraction in the feed.

The results of the incorporation of CBN into copolymers of poly(CBN-co-NBCA) for vinyl addition and free radical polymerization techniques, and into poly(CBN-co-MTDCA) for the ROMP techniques are shown in FIG. 3. Irrespective of the polymerization technique, the incorporation of CBN into the copolymers appears to be linearly dependent on its mole fraction in the feed.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

EXAMPLE 1

Instrumentation and Materials $^1H$ NMR and $^{13}C$ NMR spectra were recorded on QE-300 MHz and Varian 300 MHz spectrometers with the solvent proton and carbon signals, respectively, as standards. Infrared spectra were measured using a Nicolet Magna-™ FTIR/550 spectrometer. A Hewlett-Packard 8450A diode array UV-visible spectrophotometer was used to obtain ultraviolet spectra.

Mass spectal analyses were conducted using a Finnigan MAT TSQ-70 mass spectrometer. The purity of the monomer samples was determined with a Hewlett-Packard Series II 5890 gas chromatograph, equipped with a glass capillary column. Molecular weight determinations were made with size exclusion chromatography (SEC) using a viscotek chromatograph equipped with American Polymer Standards Corporation AM Gel 100/5, AM Gel 500/5 and AM Gel Linear/5 columns at 25° C., with tetrahydrofuran as eluent. Molecular weights are presented as polystyrene equivalents, unless noted otherwise. Thermal analyses were performed with a Perkin-Elmer Series-7 DSC Differential Scanning Calorimeter and a Perkin-Elmer Series-7 TGA7 Thermogravimetric Analyzer under a nitrogen atmosphere at a heating rate of 20° C./min. Resist film thickness was measured with a Tencor Alpha-Step. Deep-UV exposure was made using a GCA XLS KrF (248 nm) excimer laser stepper. The imaging system had a lens of 0.56NA using annular illumination with 0.5 and 0.73 inner and outer sigma. Scanning electron micrographs were recorded on an AMRAY Instruments Scanning Electron Microscope.

The dry etch-resistance of the resist polymers was determined using Lam Research Model Rainbow Plasma Etcher under aggressive $Cl_2$/HBr plasma as follows: The resist polymer, co- and terpolymer solutions were coated on 8 in. sillicon wafer to a thickness of 0.6–0.7 $\mu$m, baked at 150 for 60 seconds, and then etched under $Cl_2$/HBr plasma. The $Cl_2$ and HBr flow rates were 280 and 125 sccm, respectively. The top and bottom electrodes were maintained at 60° C. Two samples of each resist polymer were etched for 60 s. The film thicknesses were measured before and after etching on a Prometrix SM-200 film thickness probe. The etch rate for each run was calculated by dividing the decrease in thickness of the resist film by the etching time, and the etch rate for each polymer was taken as the average obtained for two runs of each polymer sample.

All chemicals were purchased from Aldrich Chemical Co. and used as received with the following exceptions. Norbornene carboxylic acid (NBCA) was purchased from Pfaltz and Bauer, and used as received. Cyclopentadiene was obtained by cracking dicyclopentadiene and used immediately. Bis(tricyclohexylphosphine)benzylidine ruthenium dichloride was obtained from Strem Chemicals Inc. 8-methyl-8-carboxy tetracyclo(4,4,0.1$^{2,5}$,1$^{7,10}$)dodec-3-ene or Methyltetracyclododecene carboxylic acid (MTDCA) was obtained by the hydrolysis of 8-methyl-8-methoxycarbonyl tetracyclo(4,4,0.1$^{2,5}$,1$^{7,10}$)dodec-3-ene (obtained from Japan Synthetic Rubber Company). Bis-tetrafluoroborate tetrakis(cyanomethane) palladium (Pd $(CH_3CN)_4)(BF_4)_2$ and bis-tetrafluoroborate tetrakis (cyanomethane) nickel (Ni$(CH_3CN)_4)(BF_4)_2$ were prepared according to the procedures of Schram and Wayland (1968, incorporated herein by reference) and Sen et al. (1988, incorporated herein by reference). ($\eta^3$-allyl)palladium(II) complexes with tetrafluoroborate and hexafluoroantimonate counterions were prepared in-situ according to the procedures of Mathew et al. (1996, incorporated herein by reference). di-$\mu$-Chlorobis-(6-methoxy bicyclo(2.2.1)hept-2-ene-endo-5$\sigma$, 2$\pi$)di-palladium(II) was prepared according to the procedures of Safir and Novak (1995, incorporated herein by reference). Tetrabutylammonium hexatungstate (VI), tetrabutylammonium hexamolybdate (VI), tetrabutylammonium octamolybdate (VI), and tetrabutylammonium trihydrogen decavanadate (V) were prepared using procedures as indicated in Table 3. Triphenylsulfonium hexafluoroantimonate was prepared according to the procedure of Crivello and Lam (1978, incorporated herein by reference). CD11 anti-reflective coating was obtained from Brewer Scientific Company. BARL antireflective coating was obtained from IBM Corporation. PD-523AD developer, 0.21N aqueous tetramethylammonium hydroxide solution with surfactant was obtained from Japan Synthetic Rubber Company. NMD was purchased from TOK.

EXAMPLE 2

Synthesis of Monomers 2-methyl propyl bicyclo (2.2.1)hept-5-ene-2-carboxylate and (carbo-tert-butoxynorbornene) (CBN)

132.0 g (2.0 mol) of freshly cracked cyclopentadiene (CPD) was added (dropwise) to a stirred solution of 256.0 g (2.0 mol) of tert-butyl acrylate and 2 g (9.6 mmol) of 3,5-di-tert-butyl phenol. The mixture was stirred for 6–8 hours at 140° C., and the product obtained by vacuum distillation as a colorless oil (291 g, 75%): bp 100° C./20 mmHg; GC (99% purity, exo/endo=30/70%); FTIR (cm$^{-1}$) 2950 (C—H), 2900 (C—H), 1730(C=O) 1140 (C—O—C); MS (CI+) m/z=195 (M+1); $^1$H NMR (CDCl$_3$, δ)1.35 (s, 9H, =C(CH$_3$)$_3$), 1.8 (m, 1H), 2.1 (m, 1H), 2.85 (bm, 2H), 3.14 (2H, bridged-head protons), 5.9 (bm, 2H, endo-olefinic) 6.1 (m, 2H, exo-olefinic protons), 6.15 (bm, 2H, endo-olefinic protons). $^{13}$C-NMR (CDCl$_3$, δ) 27.9 (C(CH$_3$)$_3$), 28.7, 30.0, 41.3, 42.4, 43.9, 44.0, 45.7, 46.0, 46.3, 49.4, (76.6, 77.0, 77.4, CDCl$_3$), 79.4, 131.9, 135.6, 137.2, (173.5, 175.5, carbonyl). Anal. Calc. for (Cl$_{12}$H$_{18}$O$_2$)$_n$: C, 74.22; H, 9.28. Found: C, 74.28; H, 9.55.

CBN (endo/exo ratio 70/30) was synthesized by the Diels-Alder reaction between cyclopentadiene and tert-butyl acrylate as shown in FIG. 14. The chromatogram in FIG. 14 showing the resolved isomers also illustrates the relative ratio of exo/endo isomers (exo:endo~30/70%). Carbomethoxynorbornene (CMN) was synthesized using the same approach.

EXAMPLE 3

Synthesis of 4,8-Di-t-butyl-tricyclo(5.2.1.0$^{2,6}$) decanedicarboxylate 4,8-Bis(hydroxymethyl)tricyclo(5.2.1.0$^{2,6}$)decane (68.0 g, 346 mmol) was dissolved in 600 ml dichloromethane. Tetrabutylammonium bromide (1.12 g, 3.46 mmol) was added and the solution was chilled to 0° C. A solution of potassium permanganate (219 g, 1.37 mol) in 2 liters of water was added slowly. The reaction was allowed to stir for 2 hr at 0° C. then 12 hr at 20° C. Sodium bisulfite was added until no permanganate remained. The two phase mixture was acidified with 5% H2SO$_4$ to pH 3. The phases were separated and the organics dried over Na$_2$SO$_4$. Solvent was removed to yield 28.8 g (37.1%) of a viscous white oil. FT-IR: (KBr, cm$^{-1}$) ν 1707 (C=O); 3200 (OH). MS (CI+) m/z=225 (M+1).

The crude diacid (17.3 g, 77.1 mmol) was dissolved in 250 ml of distilled CH$_2$Cl$_2$. Dimethyl aminopyridine (DMAP) (0.50 g, 4.1 mmol) and t-butanol (28.6 g, 386 mmol) were added and the solution was chilled to 0° C. Dicyclohexyl carbodiimide (DCC) (38.8 g, 193 mmol) was added and the solution was allowed to stir for 1 hr at 0° C. The ice bath was removed and the solution was allowed to warm to room temperature and to stir for 16 hr. The white precipitate that formed was filtered and the filtrate concentrated and passed over a short column of silica using hexanes to first remove unreacted DCC (R$_f$=1.00) then flushed with ethyl acetate to remove the desired product. Yield=13.2 g (51%) based on diol. FT-IR: (KBr, cm$^{-1}$): ν 1707 (C=O); 1743 (C=O), 2921 (C—H), 2863 (C—H) 1229 (C—O). UV(CH$_3$CN): ε$_{193}$=700; ε$_{197}$=800. MS (CI+) m/z=337 (M+1). TGA: T$_d$=125° C. (onset); mass loss=32.6%; calc'd for 2×C$_4$H$_8$=33.3%. Anal. calc'd for C$_{20}$H$_{32}$O$_4$: C: 71.39%, H: 9.59%; found: C: 71.80%, H: 9.35%.

EXAMPLE 4

General Procedure for the Synthesis of Vinyl Addition Polymers

Method A. A serum bottle charged with a solution of 51.5 mmol of the monomer in 20 ml of nitromethane and magnetic stir bar was sealed with a Teflon-lined rubber septum. The solution was degassed and the vessel back-filled with N$_2$. A solution of 0.2 mmol of (Pd(MeCN)$_4$)(BF$_4$)$_2$ in acetonitrile was then introduced by means of a syringe. The reacting mixture was then stirred for 72 hours at room temperature, after which it was poured into acetonitrile. The precipitated white polymer was filtered, dissolved in tetrahydrofuran, reprecipitated in acetonitrile and filtered. This precipitation procedure was repeated as necessary to produce a white polymer, which then was dried overnight in a vacuum oven at 60° C.

Method B. A three-neck flask equipped with a reflux condenser was charged with a solution of 51.5 mmol of the monomer in 20 ml of nitromethane and magnetic stirrer, and sealed with rubber septa. The solution was degassed and the vessel back-filled with N$_2$. A solution of 0.2 mmol of (Pd(MeCN)$_4$)(BF$_4$)$_4$ in acetonitrile was then introduced by means of a syringe. The mixture was left to react for 72 hours at room temperature, after which it was poured into acetonitrile. The precipitated white polymer was filtered, dissolved in tetrahydrofuran, reprecipitated in acetonitrile and filtered. This precipitation procedure was repeated as necessary to produce a white polymer, which then was dried overnight in a vacuum oven at 60° C.

Removal of the Palladium catalyst. 100 ml of a 5% solution of the polymer in THF was placed in a 250 ml three-neck round bottom flask fitted with a dispersion tube that was inserted below the surface of the solution. Hydrogen gas was bubbled through the solution at a slow rate for 3–4 hrs. The resulting dark precipitate was allowed to stand overnight to aggregate and settle on the bottom of the flask. The black residue was removed by filtration through a celite pad and the clean colorless filtrate was concentrated to approximately 10 ml and then added to a solution of 200 ml of acetonitrile to precipitate the polymer. The sample was isolated by filtration and dried in a vacuum oven at 60° C. The main recovery was 80%.

Synthesis of Poly(2-methylpropyl bicyclo(2.2.1)hept-5-ene-2-carboxylate) or Poly(carbo-tert-butoxynorbornene) (Poly (CBN)).

Poly(CBN) was isolated as a white solid in 30% yield. $^1$H NMR (CDCl$_3$) δ=1.4 (—C(CH$_3$)$_3$), 2.0–3.0 (—CH$_2$, —CH (bridge-head, main chain)). FTIR (film on NaCl plate, cm$^{-1}$) 2900–3000 (C—H), 1720 (C=O), 1150 (C—O—C). GPC: Mw=10,000, Mn=6000. TGA: decomposition temperature (Td): 250° C. Anal. Calcd. for (C$_{12}$H$_{18}$O$_2$): C, 74.00; H, 9.00. Found C, 73.58, H, 8.83, N, <0.5 (trace elements: Pd, 130, F, <64, B, 30 ppm).

Synthesis of Poly(bicyclo(2.2.1)hept-5-ene-2-carboxylic acid) or Poly(2-norbornene carboxylic acid) (Poly(NBCA))

Poly(NBCA) was isolated as a white solid in 55% yield. $^1$H NMR (DMSO-d$_6$) δ=1.0–3 (br, CH$_2$, —CH (bridge-head, main chain)), 7.4 (s). FTIR (film on NaCl plate, cm$^{-1}$) 3500–3000 (OH), 2900–3000 (C—H), 1708 (C=O, carboxylic acid). GPC: Mw=9,000, Mn=6000. TGA: Td=250° C. Anal. Calcd. for (C$_8$H$_{10}$O$_2$): C, 69.56; H, 7.25. Found C, 65.68, H, 7.72, N, <0.5 (trace elements: Pd, 121, F, <64, B, 20 ppm).

Synthesis of Poly(2-methylpropyl bicyclo(2.2.1)hept-5-ene-2-carboxylate-co-bicyclo(2.2.1)hept-5-ene-2-carboxylic acid) or Poly (carbo-tert-butoxynorbornene-co-2-norbornene carboxylic acid) (Poly(CBN-co-NBCA).

Poly(CBN-co-NBCA) was synthesized from a charge of CBN/NBCA=70/30 mole % ratio, and isolated as a white solid in 35% yield. $^1$H NMR (CDCl$_3$) δ=1.4 (—C(CH$_3$)$_3$), 2–3.0 (—CH$_2$, —CH (bridge-head, main chain)). FTIR (film on NaCl plate, cm$^{-1}$) 3400–3200 (OH), 2900–3000 (C—H), 1720(C=O, ester), 1705 (C=O, carboxylic acid), 1150 (C—O—C, ester). GPC: Mw=9,000, Mn=6000. TGA: Td=250° C. Anal. Calcd. for (C$_{12}$H$_{18}$O$_2$)$_{0.66}$/(C$_8$H$_{10}$O$_2$)$_{0.34}$: C, 72.05; H, 8.62. Found C, 71.67, H, 8.89, N, <0.5 (trace elements: Pd, 339, F, <290, B, <50 ppm). The feed composition was (C$_{12}$H$_{18}$O$_2$)$_{0.7}$/(C$_8$H$_{10}$O$_2$)$_{0.3}$.

herein by reference; 1977, incorporated herein by reference). A three neck flask fitted with a reflux condenser was charged with 51.5 mmoles of the monomer in 20 ml of propylene glycol methylether acetate (PGMEA) and 84.7 mmol of di-tert-butyl peroxide, or 2 mol % of AIBN (relative to concentration of monomer) in dry THF. The mixture was degassed and the vessel back-filled with nitrogen. It was then stirred and heated at 130° C. (for DTBP-initiated reactions) or 65° C. (for AIBN-initated reactions) for 24 hours, after which it was poured into hexanes to precipitate the polymer. The precipitated polymer was filtered, dissolved in THF, reprecipitated in hexanes, and filtered. This precipitation procedure was repeated as necessary, and finally, the resulting polymer was dried overnight in a vacuum oven at 60° C. For co-polymers containing maleic

TABLE 1

Vinyl Addition Polymerization[a]

| No. | Catalyst | Mon. | Mon/Cat. | Time (hr) | Temp (°C.) | Mw | Mn | Yield (%) |
|---|---|---|---|---|---|---|---|---|
| 1 | (Pd(CH$_3$CN)$_4$)(BF$_4$)$_2$ | CBN | 300 | 72 | 25 | 10000 | 6000 | 20 |
| 2 | (Pd(CH$_3$CN)$_4$)(BF$_4$)$_2$ | CBN | 200 | 72 | 25 | 9800 | 6000 | 30 |
| 3 | (Pd(CH$_3$CN)$_4$)(BF$_4$)$_2$ | CBN | 160 | 96 | 25 | 6700 | 4800 | 30 |
| 4 | (Pd(CH$_3$CN)$_4$)(BF$_4$)$_2$ | CBN | 100 | 72 | 25 | 6500 | 4500 | 32 |
| 5 | (Pd(CH$_3$CN)$_4$)(BF$_4$)$_2$ | CBN | 80 | 24 | 25 | 3500 | 2500 | 33 |
| 7 | (Pd(CH$_3$CN)$_4$)(BF$_4$)$_2$ | CBN/NBCA = 80/20 | 200 | 72 | 25 | 10000 | 6000 | 35 |
| 8 | (Pd(CH$_3$CN)$_4$)(BF$_4$)$_2$ | CBN/NBCA = 90/10 | 100 | 68 | 25 | 19000 | 6000 | 35 |
| 9 | (Pd(CH$_3$CN)$_4$)(BF$_4$)$_2$ | CBN/NBCA = 80/20 | 100 | 150 | 25 | 10000 | 6000 | 55 |
| 10 | (Pd(CH$_3$CN)$_4$)(BF$_4$)$_2$ | CBN/NBCA = 70/30 | 100 | 65 | 25 | 9300 | 5000 | 41 |
| 11 | (Pd(CH$_3$CN)$_4$)(BF$_4$)$_2$ | CBN/NBCA = 80/20 | 50 | 72 | 25 | 5000 | 4000 | 60 |
| 12 | (Pd(CH$_3$CN)$_4$)(BF$_4$)$_2$ | NBCA | 100 | 150 | 25 | 10000 | 6000 | 55 |
| 13 | (Ni(CH$_3$CN)$_4$)(BF$_4$)$_2$ | CBN | 100 | 48 | 25 | — | — | 0 |
| 14 | (Ni(CH$_3$CN)$_4$)(BF$_4$)$_2$ | CBN | 100 | 48 | 25 | — | — | 0 |
| 15 | PdCl$_2$ | CBN | 100 | 96 | 25 | — | — | 0 |
| 16 | {(η$^3$-allyl)Pd(BF$_4$)[b] | CBN | 100 | 72 | 25 | 5000 | 3700 | 20 |
| 17 | {(η$^3$-allyl)Pd(SbF$_6$)[b] | CBN | 100 | 72 | 25 | 5000 | 3600 | 20 |
| 18 | CMNDP[c,d] | CBN | 100 | 96 | 25 | — | — | 0 |
| 19 | CMNDP[c,e] | CBN | 100 | 96 | 25 | — | — | 0 |

[a]All polymerizations were carried out with 52 mmol of monomer (exo/endo = 30/70) in 20 ml of nitromethane, except otherwise stated.
[b]The catalysts were prepared in situ, using the procedure of Mathew et al. (1996), incorporated herein by reference.
[c]The catalysts were prepared, using the procedure of Safir and Novak (1995),incorporated herein by reference.
[d]Polymerization was carried out in 20 ml of tetramethyl urea.
[e]Polymerization was carried out in 20 ml of THF.
(Pd(CH$_3$CN)$_4$)(BF$_4$)$_2$: Bis-tetrafluoroborate tetrakis(cyanomethane) palladium.
(Ni(CH$_3$CN)$_4$)(BF$_4$)$_2$: Bis-tetrafluoroborate tetrakis(cyanomethane) nickel.
CMNDP: di-$\mu$-chlorobis-(6-methoxy bicyclo(2.2.1)hept-2-ene-endo-5σ,2πdipalladium (II).

The yields of the polymers made by (Pd(CH$_3$CN)$_4$)(BF$_4$)$_2$ catalyzed vinyl addition polymerization of CBN with an exo/endo mole ratio of approximately 30/70 were relatively low. A gas chromatography (GC) analysis of the unreacted monomer after the reaction revealed that a disproportionate fraction of the exo isomer polymerized versus the endo isomer. The reaction conditions, yields, and molecular weights of these polymers are summarized in Table 1. Those made with {(η$^3$-allyl)Pd(BF$_4$)} and {(η$^3$-allyl)Pd(SbF$_6$)} catalysts had relatively low molecular weights (Mw~5000, Mn~4000); and their yields were also low (ca. 20%).

EXAMPLE 5
General Procedure for the Synthesis of Free Radical Polymers

These materials were prepared by an adaptation of the procedure published by Gaylord, et. al. (1976, incorporated anhydride, an additional precipitation step was employed after the first dissolution/precipitation in THF and hexanes. This involved dissolving the polymer in THF and precipitating in water. The solution was allowed to sit for several hours to remove unreacted maleic anhydride which is soluble in water and then filtered. The solid was then dried overnight in a vacuum oven at 100° C.

Poly(2-methylpropyl bicyclo(2.2.1)hept-5-ene-2-carboxylate) or Poly(carbo-tert-butoxynorbornene) (Poly (CBN)).

Poly(CBN) was isolated as a white solid with a tinge of yellow color in 50% yield. $^1$H NMR (CDCl$_3$) δ=1.4 (—C(CH$_3$)$_3$), 2.0–2.8 (—CH$_2$, —CH (bridge-head, main chain)). FTIR (film on NaCl plate, cm$^{-1}$) 2900–3000 (C—H), 1720 (C=O), 1150 (C—O—C). GPC: Mw=13000, Mn=8000. TGA: Td=250° C. Anal. Calcd. for (C$_{12}$H$_{18}$O$_2$): C, 74.22; H, 9.28. Found: C, 74.16, H, 9.08

Poly(bicyclo(2.2.1)hept-5-ene-2-carboxylic acid) or Poly(2-norbornene carboxylic acid) (Poly(NBCA))

Poly(NBCA) was isolated as a white solid in 30% yield. $^1$H NMR (DMSO-d$_6$) δ=1.0–3 (br, CH$_2$, —CH (bridge-head, main chain)), 7.4 (s). FTIR (film on NaCl plate, cm$^{-1}$) 3500–3000 (OH), 2900–3000 (C—H), 1708 (C=O, carboxylic acid). GPC: Mw=1,500, Mn=1,100. TGA: Td=250° C. Anal. Calcd. for (C$_8$H$_{12}$O$_2$): C, 69.56; H, 7.25. Found: C, 67.87, H, 6.91.

Poly(2-methylpropylbicyclo(2.2.1)hept-5-ene-2-carboxylate-co-bicyclo(2.2.1)hept-5-ene-2-carboxylic acid) or Poly(carbo-tert-butoxynorbornene-co-2-norbornene carboxylic acid) (Poly(CBN-co-NBCA)).

Poly(CBN-co-NBCA) was synthesized from a charge of CBN/NBCA=80/20 mole %, and isolated as a white solid with a tinge of yellow color in 59.3% yield. $^1$H NMR (CDCl$_3$) δ=1.4 (—C(CH$_3$)$_3$), 2–3.0 (—CH$_2$, —CH (bridge-head, main chain)). FTIR (film on NaCl plate, cm$^{-1}$) 3400–3200 (OH), 2900–3000 (C—H), 1720(C=O, ester), 1705 (C=O, carboxylic acid), 1150 (C—O—C). GPC: Mw=30000, Mn=12000. TGA: Td=250° C., Anal. Calcd. for (C$_{12}$H$_{18}$O$_2$)$_{0.777}$/(C$_8$H$_{10}$O$_2$)$_{0.223}$: C, 73.44; H, 8.93. Found C, 7285, H, 9.45. The feed composition was (C$_{12}$H$_{18}$O$_2$)$_{0.8}$/(C$_8$H$_{10}$O$_2$)$_{0.2}$.

Poly(2-methylpropyl bicyclo(2.2.1)hept-5-ene-2-carboxylate-co-maleic anhydride) or Poly(carbo-tert-butoxynorbornene-co-maleic anhydride) (Poly(CBN-co-MAH)).

(Poly(CBN-co-MAH)) was synthesized from a charge of CBN/MAH=60/40 mole %, and isolated as a white solid in 70% yield. $^1$H NMR (CDCl$_3$) δ=1.4 (—C(CH$_3$)$_3$), 2–3.0 (—CH$_2$, —CH (bridge-head, main chain)). FTIR (film on NaCl plate, cm$^{-1}$) v: 2977–2890 (C—H), 1867–1786 (C=O, cyclic anhydride), 1729(C=O, ester), 1158–1059 (C—O—C, aliphatic ester), 930–850(C—O—C, cyclic anhydride). GPC: Mw=7000, Mn=5000. TGA: Td=250° C. Anal. Calcd. for (C$_{12}$H$_{18}$O$_2$)$_{0.5}$/(C$_4$H$_2$O$_3$)$_{0.5}$: C, 65.75; H, 6.85. Found: C, 64.91, H, 6.81.

Poly(2-methylpropylbicyclo(2.2.1)hept-5-ene-2-carboxylate-co-maleic anhydride-co-8-methyl-8-carboxy tetracyclo(4,4,0.1$^{2,5}$,1$^{7,10}$)dodec-3-ene or Poly(carbo-t-butoxy norbornene-co-maleic anhydride-co-methyltetracyclododec-3-ene carboxylic acid) (Poly(CBN-co-MAH-co-MTDCA)).

(Poly(CBN-co-MAH-co-MTDCA)) was synthesized from a charge of CBN/MAHMTDCA=40/50/10 mole %, and isolated as a white solid in 40% yield. $^1$H NMR (CDCl$_3$) δ=1.4 (—C(CH$_3$)$_3$), 2–3.0 (—CH$_2$, —CH (bridge-head, main chain)). FTIR (film on NaCl plate, cm$^{-1}$) v: 3500–3100 (OH, carboxylic acid) 2977–2890 (C—H), 1867–1786 (C=O, cyclic anhydride), 1724(C=O, ester), 1158–1059 (C—O—C, aliphatic ester), 930–850(C—O—C, cyclic anhydride). GPC: Mw=4000, Mn=2000. TGA: Td=250° C., Poly(bicyclo(2.2.1)hept-5-ene) or Poly(norbornene) (Poly (NBE))

Poly(NBE) was isolated as a white solid in 60% yield. $^1$H NMR (C$_6$D$_6$) δ=1.0–2 (br, CH$_2$, —CH (bridge-head, main chain)). FTIR (film on NaCl plate, cm$^{-1}$) 3100–2900 (—CH$_2$), 1900 (C—H). GPC: Mw=1300, Mn=900. TGA: Td=400° C.

TABLE 2

| | | Free radical polymerization | | | | | | |
|---|---|---|---|---|---|---|---|---|
| Trial # | Monomer | Initiator | Mon./Init. | Temp (°C.) | Time (hr) | Mw | Mn | Yield (%) |
| 1 | CBN[a] | DTBP | 1.36 | 118 | 30 | 7000 | 5000 | 25 |
| 2 | CBN[a] | DTBP | 1 | 118 | 30 | 10000 | 6400 | 40 |
| 3 | CBN[a] | DTBP | 0.63 | 118 | 30 | 12000 | 7000 | 40 |
| 4 | CBN[a,c] | DTBP | 3.7 | 130 | 48 | 38000 | 9000 | 40 |
| 5 | CBN[a] | DTBP | 1 | 105 | 48 | — | — | Trace |
| 6 | CBN/NBCA[b] = 80/20 mol% | DTBP | 1 | 130 | 1.5 | 1400 | 700 | 30 |
| 7 | CBN/NBCA[b] = 90/10 mole% | DTBP | 0.7 | 130 | 18 | 3000 | 1400 | 50 |
| 8 | CBN/NBCA[b] = 70/30 mol% | DTBP | 1.8 | 130 | 18 | 5000 | 400 | 50 |
| 9 | NBCA[a] | DTBP | 1 | 118 | 18 | 1500 | 1000 | 50 |
| 10 | NBE | DTBP | 2 | 115 | 24 | 1400 | 900 | 50 |
| 11 | CBN/NBCA[d] = 70/30 mol% | AIBN | 100 | 65 | 24 | 1200 | 800 | 10 |
| 12 | CBN/NBCA[e] = 80/20 mol% | AIBN | 10 | 70 | 24 | 900 | 500 | 10 |
| 13 | CBN/MAH[d] = 70/30 mol% | AIBN | 50 | 65 | 24 | 7000 | 4000 | 65–70 |
| 14 | CBN/MAH[d] = 60/40 mol% | AIBN | 50 | 65 | 24 | 7000 | 5000 | 70 |
| 15 | CBN/MAH[d] = 50/40 mol% | AIBN | 50 | 65 | 18 | 6500 | 5000 | 50 |
| 16 | CBN/MAH/MTDCA = 41/50/9 | AIBN | 50 | 65 | 40 | 4000 | 1700 | 40 |
| 17 | CBN/MTDCA | AIBN | 65 | 50 | 24 | — | — | trace |
| 18 | NBCA | AIBN | 65 | 25 | 43 | 1500 | 1100 | 30 |

[a]Polymerization was carried out neat in a serum bottle.
[b]Polymerization was carried out in propylene glycol monomethyl ether acetate in a round bottom flask under a nitrogen atmosphere.
[c]Polymerization was carried out in a glass tube sealed under vacuum.
[d]Polymerization was carried out in THF.
[e]Polymerization was carried out in benzene.

The yields of the free radical polymerization were moderate, and dependent on the temperature and length of time of the reaction, the nature of initiator used, as well as presence or absence of solvent (see Table 2). Bulk polymerization afforded higher yields than solution polymerization. Only traces of polymer was obtained with di-tert-butyl peroxide (DTBP) when the reaction was carried out at 105° C., a temperature lower than the boiling point (109° C.) of DTBP.

The molecular weights of the polymers obtained with DTBP initiator by Gaylord's procedure (Gaylord et al. 1976; incorporated herein by reference) were modest and the polymers were typically light light yellow in color. When dilute solutions of these polymers in THF were poured into methanol, followed by the addition of water and a few drops of HCl to break the resulting emulsion, white polymers were obtained. Excellent results were obtained by co- and ter-polymerizing CBN with maleic anhydride, maleimide, NBCA and MTDCA at 65° C., using azobisisobutyronitrile (AIBN) in appropriate solvents.

EXAMPLE 6

General Procedure for the Synthesis of Ring Opening Metathesis Polymers

To a round bottom flask charged with 15 ml of the mixed solvent (water/ethanol/p-dioxane=3/5/7 (v/v.) was added 50 mmol of the monomer, 0.5 mmol of dipotassium hexacholoro iridate ($K_2IrCl_6$ (catalyst)), 5 mmol of Zn (reducing agent), 50 mmol of acetic acid, and 0.5 mmol of 1-decene (molecular weight regulator). The resulting mixture was stirred at a constant temperature of 50° C. for 24 h, after which it was diluted with THF and then filtered to remove the residual catalyst and zinc acetate. The filterate was poured into methanol to precipitate the polymer. The recovered polymer was redissolved in THF, and reprecipitated in methanol. This procedure was repeated twice. The final product was dried in vacuo at 60° C.

Poly(2-methylpropyl bicyclo(2.2.1)hept-5-ene-2-carboxylate or Poly(carbo-tert-butoxynorbornene) (Poly (CBN)).

Poly(CBN) was isolated as light yellow solid in 89% yield. $^1$H NMR (CDCl$_3$) δ=1.4 (—C(CH$_3$)$_3$), 1.6–3.2 (—CH$_2$, —CH (bridge-head, main chain)), 5.21–5.4 (vinyl). FTIR (film on NaCl plate, cm$^{-1}$) ν: 1740(C═O), 1120 (C—O—C), 990 (C═C—H, trans), 740 (C═C—H, cis). GPC: Mw=43000, Mn=19000. DSC: Tg=85° C. TGA: Td=250° C.

Poly(2-methylpropylbicyclo(2.2.1)hept-5-ene-2-carboxylate-co-2-methylbicyclo (2.2.1)hept-5-ene-2-carboxylate) or Poly(carbo-tert-butoxy norbornene-co-carbomethoxynorbornene) (Poly(CBN-co-CMN)).

Poly(CBN-co-CMN) was synthesized from a charge of CBN/CMN=80/20 mole % ratio, and was isolated a lightly yellow-colored solid in 66% yield. $^1$H NMR (CDCl$_3$) δ=1.4 (—C(CH$_3$)$_3$), 1.6–3.2 (—CH$_2$, —CH (bridge-head, main chain)), 3.65 (—OCH$_3$) 5.21–5.4 (vinyl). FTIR (film on NaCl plate, cm$^{-1}$) ν: 1740(C═O), 1120 (C—O—C), 990 (C═C—H, trans), 740 (C═C—H, cis). GPC: Mw=101000, Mn=54000. DSC: Tg=85° C. TGA: Td=250° C. Composition: CBN/CMN=81/19 (mol %, by $^1$H NMR).

Poly(2-methylpropylbicyclo(2.2.1)hept-5-ene-2-carboxylate-co-8-methyl-8-carboxy tetracyclo(4,4,0.1$^{2,5}$,1$^{7,10}$)dodec-3-ene or Poly(carbo-t-butoxy norbornene-co-methyltetracyclododecene carboxylic acid) (Poly(CBN-co-MTCDCA)).

Poly(CBN-co-MTCDCA) was synthesized from a charge of CBN/MTDCA=80/20 mole %), and was isolated as a lightly yellow-colored solid in 75% yield. $^1$H NMR (CDCl$_3$, δ) 1.4 (—C(CH$_3$)$_3$), 2.0–2.8 (—CH$_2$, —CH (bridge-head, main chain)), 5.2–5.4 (vinyl proton). FTIR (film on NaCl plate, cm$^{-1}$) ν: 3600 (OH), 1729(C═O), 1120 (C—O—C), 970 (C═C—H, trans), 848 (C═C—H, cis). GPC: Mw=59000, Mn=16000. DSC: Tg=122° C. TGA: Td=250° C.

TABLE 3

Evaluation of the catalytic capacity of some ROMP$^a$ catalysts to initiate the polymerization of CBN.

| Trial # | Catalyst | Solvent | Temp (°C.) | Time (hr) | Yield (%) |
|---------|----------|---------|------------|-----------|-----------|
| 1 | WCl$_6$/AlEt$_3$ | CB | 25 | 24 | 0 |
| 2 | WCl$_6$/AlEt$_3$ | Toluene | 80 | 24 | 0 |
| 2 | TBAHT | Hexanes | 25 | 72 | 0 |
| 3 | TBAHM | Hexanes | 25 | 72 | 0 |
| 4 | TBAOM | Hexanes | 25 | 72 | 0 |
| 5 | TBATHDV | Hexanes | 25 | 72 | 0 |
| 7 | RuCl$_3$.3H$_2$O | W/E. | 50 | 24 | 6 |
| 8 | RuCl$_3$ | W/E/D$^d$ | 50 | 24 | 0 |
| 9 | IrCl$_3$ | W/E/D$^d$ | 50 | 48 | 0 |
| 10 | K$_3$IrCl$_6$(Ir$^{3+}$) | W/E/D$^d$ | 50 | 24 | 0 |
| 11 | K$_2$IrCl$_6$(Ir$^{4+}$)$^b$ | W | 50 | 24 | 20 |
| 12 | K$_2$IrCl$_6$(Ir$^{4+}$)$^c$ | W/E/D$^d$ | 50 | 24 | 28.3 |
| 13 | BTPR | THF | 50 | 72 | 0 |
| 14 | BTPR | Toluene | 50 | 72 | 4.4 |

$^a$Polymerization was carried out using 50 mmol CBN and 0.5 mmol (1 mol-%) of catalyst in 15 ml of solvent.
$^b$5 mmol of Zn/50 mmol of acetic acid was used as reducing agent; 5 mmol of sodium dodecyl sulfate was used as the emulsifying agent.
$^c$5 mmol of Zn/50 mmol of acetic acid was used as reducing agent
$^d$W(water)/E(ethanol)/D(p-dioxane) = 3/5/7 by volume.
CB: Chlorobenzene; THF: Tetrahydro furan
BTPR: Bis(tricyclohexylphosphine)benzylidine ruthenium dichloride
TBAHT: Tetrabutylammonium hexatungstate (VI) - prepared using procedure of Hur et al. (1990a; incorporated herein by reference); TBAHM: Tetrabutylammonium hexamolybdtate (VI) - prepared using procedure of Hur et al. (1990b; incorporated herein by reference); TBAOM: Tetrabutylammonium octamolybdate (VI) - - prepared using procedure of Fournier (1990; incorporated herein by reference); TBATHDV: Tetrabutylammonium trihydrogen decavanadate (V) - prepared using literature procedure of Klemperer and Yaghi (1990; incorporated herein by reference)

Figure 2:
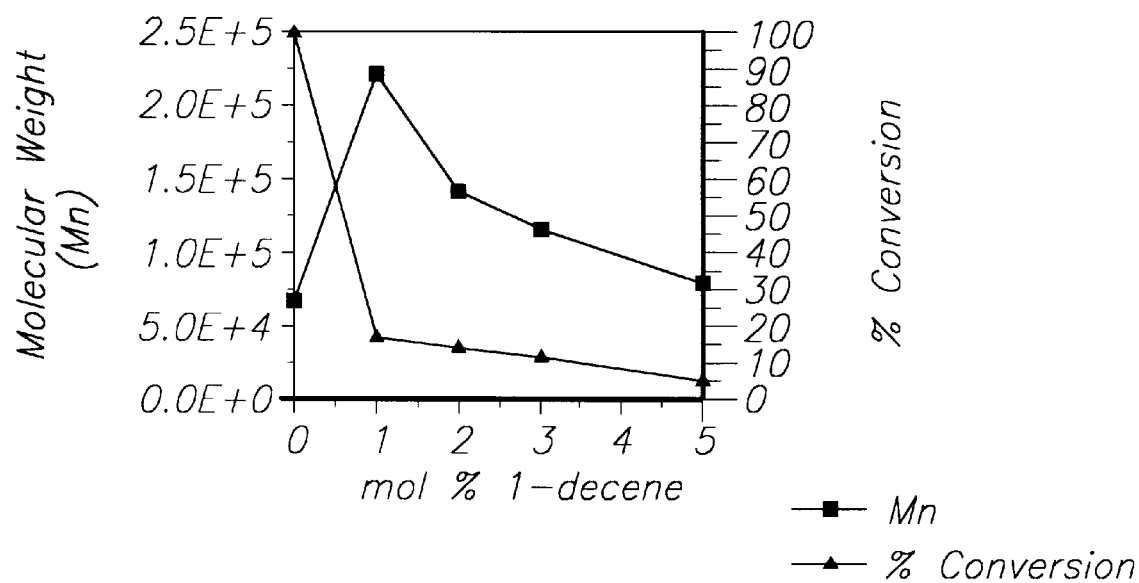
FIG. 2. Control of ROMP polymer molecular weight with 1-decene.

The yield of the ROMP polymerizations was high as were the molecular weights of the products. The molecular weights of these polymers can be controlled by addition of alpha-olefins, such as 1-decene, to the feed. Under these conditions, there is a trade off between yield and molecular weight as shown in FIG. 2. Photoresist formulations are best prepared from polymers with somewhat lower molecular weights so that solutions with higher solid content and lower viscosity can be prepared. Therefore, the ability to control molecular weight by this means and other means is desirable.

The results of polymerizations of CBN with various ROMP catalysts are summarized in Table 3. $K_2IrCl_6$ in the presence of acetic acid and zinc (reducing agent). A mixed solvent of water/ethanol/p-dioxane=3/5/7 (v/v) gave the best yield (28.3%). It was also possible to copolymerize CBN with CMN and MTDCA under these conditions. However, this catalyst system was unable to homopolymerize norbornene carboxylic acid. This may be due to the formation of a complex between Ir$^{4+}$ and the carboxylic acid group.

Although there exist numerous sophisticated catalysts that can be used in ROMP (Gilliom and Grubbs 1986; Cannizzo and Grubbs 1987; Cannizzo and Grubbs 1988; Wallace et al. 1986; Wallace and Schrock 1987; Schrock et al. 1987; Schaverien et al. 1986; Murzdek and Schrock 1987) most of them require anhydrous conditions, which were not required nor desirable for the production of the resist compositions of the present invention. However, it is contemplated that these catalysts would also work in the present invention.

EXAMPLE 7

General Procedure for the Hydrogenation of the ROMP-Derived Polymers

Method A. To a stirred solution of (2.0 g, 10 mmol) of the ROMP-derived polymer in 40 ml of propylene glycol monomethyl ether (PGME) and 20 ml of THF, was added hydrazine monohydrate (40 mmol), tert-butyl peroxide (40 mmol) and acetic acid (40 mmol). The reaction mixture was stirred at 50° C. for 72 h, after which it was poured into 500 ml of methanol. The recovered polymer was purified by repeated precipitation from THF into methanol. It was dried in vacuo at 60° C.

Method B. To a stirred solution of (2.0 g, 10 mmol) of the ROMP-derived polymer in 50 ml of 1,4-dioxane was added toluenesulfone hydrazine (4.7 g, 25 mmol) and tripropylamine (4.3 g, 30 mmol). The reaction mixture was stirred and refluxed for 4 hrs under dry $N_2$ and passed through a ½-in. layer of Celite on a glass filter to remove residual catalyst. The solution was poured into 1 L of water and acidified to pH 2 with conc. HCl. The precipitated polymer was purified and dried in the same manner as in method A above.

Hydrogenated Poly(CBN) made by method A.

Hydrogenated poly(CBN) was obtained as a white solid with 84% hydrogenation (determined by $^1H$ NMR analysis). $^1H$ NMR (CDCl$_3$) δ=1.2–1.9 (—CH$_2$—CH$_2$— main chain), 1.3 (—C(CH$_3$)$_3$), 2.0–3.2 (—CH$_2$, —CH (bridge-head, main chain)), 5.2–5.4 (vinyl). FTIR (film on NaCl plate, cm$^{-1}$) v: 2941 (C—H), 1727 (C=O), 1155 (C—O—C) GPC: Mw=28900, Mn=15000. DSC: Tg=57° C. TGA: Td=252° C. Hydrogenated Poly(2-methylpropylbicyclo(2.2.1)heptane-2-carboxylate-co-8-methyl-8-carboxy tetracyclo(4,4,0.1$^{2,5}$, 1$^{7,10}$)dodec-3-ene or Poly(carbo-t-butoxy norbornene-co-methyltetracyclododecene carboxylic acid) (Poly(CBN-co-MTCDCA))

Made by method A. Hydrogenated poly(CBN-co-MTCDCA) was obtained as a white solid in 2.74 g yield, with 82% degree of hydrogenation (determined by $^1H$ NMR analysis). $^1H$ NMR (CDCl$_3$) δ=1.16–1.91 (—CH$_2$—CH$_2$— main chain), 1.3 (—C(CH$_3$)$_3$), 2.0–2.8 (—CH$_2$, —CH (bridge-head, main chain)), 5.21–5.4 (vinyl proton). FTIR (film on NaCl plate, cm$^{-1}$) v: 3600 (—OH), 2941 (C—H), 1727(C=O), 1155 (C—O—C). DSC: Tg=107° C. TGA: Td=252° C.

Made by method B. Yield: 1.5 g; degree of hydrogenation: 100%; IR and NMR were same as that of polymer obtained with method A. GPC: Mn=10200. DSC: Tg=70° C. TGA: Td=252° C. Anal. Calcd. for $(C_{12}H_{18}O_2)_{0.774}/(C_8H_{10}O_2)_{0.226}$: C, 74.75; H, 9.24. Found: C, 73.94, H, 9.99 (trace elements: Ir, 0.04, Zn, 0.03, N, <0.5, Cl, 0.012). The feed composition was $(C_{12}H_{18}O_2)_{0.8}/(C_8H_{10}O_2)_{0.2}$.

Hydrolysis of Poly(2-methylpropylbicyclo(2.2.1)hept-5-ene-2-carboxylate-co-2-methylbicyclo (2.2.1)hept-5-ene-2-carboxylate) or Poly(carbo-tert-butoxy norbornene-co-carbomethoxynorbornene) (Poly(CBN-co-CMN)).

To a stirred solution of 4.9 g of poly(CBN-co-CMN) (CBN/CMN=81/19%) in 50 ml of PGME was added KOH (0.66 g, 10 mmol) and tetrabutyl ammonium bromide (0.32 g, 1 mmol). The mixture was stirred at 60° C. for 24 h, after which it was poured into 1 L of 2% HCl. The precipitated polymer was purified by reprecipitation from THF into water. The isolated white polymer was dried in vacuo at 60° C. Yield: 84%. $^1H$ NMR (CDCl$_3$,) δ=1.2–1.9 (—CH$_2$— CH$_2$— main chain), 1.3 (—C(CH$_3$)$_3$), 1.8–3.2 (—CH$_2$, —CH (bridge-head, main chain)), 5.2–5.4 (vinyl proton). FTIR (film on NaCl plate, cm$^{-1}$) v: 3600 (—OH), 1732, (C=O), 1705(C=O), 1149 (C—O—C). GPC: Mw=93300, Mn=51000. DSC: Tg=100° C. TGA: Td=252° C. Composition: CBN/COOH=74/26 (mol %) (determined by $^1H$ NMR analysis).

TABLE 4

The results of the hydrogenation reaction of poly(CBN)[a]

| Trial # | Oxidant (mol-%) | Solvent | Mn[b] (×10$^4$) | Temp (°C.) | Time (hr) | Conversion[c] (mol-%) |
|---|---|---|---|---|---|---|
| 1 | Air | PGME/THF | 4.33 | 25 | 24 | 76 |
| 2 | Air | PGME/THF | 3.54 | 25 | 24 | 13 |
| 3 | Air | PGME/THF | 2.97 | 25 | 24 | 15 |
| 4 | Air | PGME/THF | 3.54 | 25 | 48 | 13 |
| 5 | Air | PGME/THF | 2.97 | 25 | 48 | 42 |
| 6 | Air | Toluene | 4.33 | 25 | 24 | 37 |
| 7 | H$_2$O$_2$ | PGME/THF | 4.33 | 50 | 72 | 49 |
| 8 | TBPO[d] | PGME/THF | 4.33 | 50 | 72 | 84 |
| 9 | TBPO[d] | PGME/THF | 3.54 | 50 | 72 | 92 |
| 10 | TBPO[d] | PGME/THF | 2.97 | 50 | 72 | 94 |
| 11 | TBPO[d] | PGME/THF | 4.33 | 80 | 72 | 37 |
| 12 | TBPO[e] | 1,4-dioxane | | | 4 | 100 |

[a]Hydrogenation was carried out using 10 mmol of PCBN, 50 mmol of hydrazine monohydrate, 50 mmol of acetic acid, and 50 mmol of oxidant in 50 ml of solvent.
[b]Determined by GPC
[c]Determined by $^1H$-NMR.
[d]TBPO: tert-butyl peroxide
[e]Hydrogenation was carried out using 10 mmol of PCBN, p-toluenesulfone hydrazine (25 ml) and tripropylamine in 50 ml of 1,4-dioxane.

The ROMP-derived polymers were hydrogenated, using procedures described by Aylward and Sawistowska (1962), Miller (1965) and Hahn (1992), all incorporated herein by reference. The results of the hydrogenation of poly(CBN), a typical ROMP polymer are summarized in Table 4. One hundred percent degree of hydrogenation of the ROMP polymers was achieved using the procedure developed by Hahn (1992) (H$_2$ with tosyl hydrazide). This procedure also enabled the removal of residual metal catalyst bound to the polymer, making it possible to remove the reduced catalyst by Celite filteration. ROMP polymers hydrogenated by method A (hydrazine monohydrate in the presence of tert-butyl peroxide) required further processing to remove the metal catalyst. processing included preparing a 3–5% solution of polymer in tetrahydrofuran or suitable solvent and slowly bubbling hydrogen gas through the solution by means of a dispersion tube for 3–5 hours. The resulting dark precipitate eventually aggregated and settled on the bottom of the reaction vessel. At this point it was removed by filtration. Removing the catalyst provided polymers with a transparency of approximately 63%/μm at 193 nm.

EXAMPLE 8

General Procedure for Resist Formulation and Processing

The resist polymer (16 wt % relative to solvent), triphenylsulfonium hexafluoroantimonate (2 wt % relative to polymer weight) and plasticizer additive (8 wt % relative to polymer weight) were dissolved in propylene glycol monomethyl ether acetate and filtered through a 0.45 mm Teflon filter. Several surface preparation methods were studied. These included hexamthylenedisilane (HMDS) primed, CD11 anti-reflective coatings and BARL antireflective coating. The resists were spun at 2500 RPM to ~0.7 mm thickness on silicon wafers. The pre-exposure resist thickness was not targeted to either $E_{min}$ or $E_{max}$. The post-apply-bake process was 150° C. for 60 s (unless otherwise stated)

in hard contact with the bake plate. Exposure was made using a GCA XLS KrF (248 nm) excimer laser stepper. The wafer was subsequently baked with minimal delay (<5 min) for 60 s at 140° C. The develop process used two 15 second puddles with either 0.13N or 0.21 TMAH developer solutions with surfactant (JSR PD-523AD developer) followed by de-ionized water rinse.

Dry Etch-Resistance of the Resist Polymers

The dry etch-resistance of the resist polymers were determined using Lam Research Plasma Etcher under agressive $Cl_2$ plasma. The dry etch-resistance of some of the polymers is shown in Table 5. On the average, these polymers etch slower than novolac (monomer of m-cresol) both in oxygen and under aggressive chlorine etch conditions commonly used to etch polysilicon. The calculated Ohnishi parameters are given in FIG. 14. The calculated value for polyhydroxystyrene is 2.43 while that for Apex E (poly(4-t-butoxycarbonyloxystyrene ($C_{13}H_{16}O_3$)) is 3.2. The measured values are much lower than would be expected from a comparison of Ohnishi parameters.

TABLE 5

Etch Rate Data

| Material | Etch Rate under $Cl_2$ plasma |
|---|---|
| 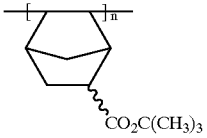<br>Poly(CBN) | 0.85 |
| 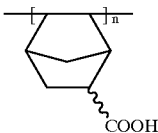<br>PolyNBCA | 0.75 |
| 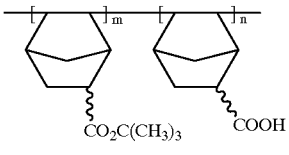<br>Poly(CBN-co-NBCA) | 0.90 |
| 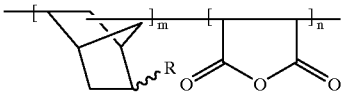<br>Poly(CBN-co-MAH)<br>R=$O_2C(CH_3)_3$ | 1.05 |
| 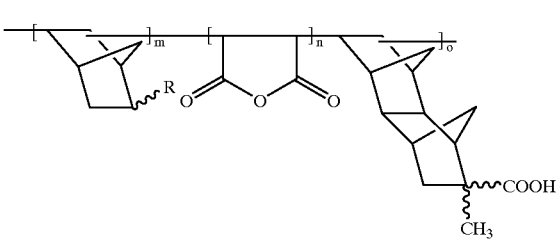<br>Poly(CBN-co-MAH-co-MTDCA) | 0.94 |

TABLE 5-continued

Etch Rate Data

| Material | Etch Rate under $Cl_2$ plasma |
|---|---|
| 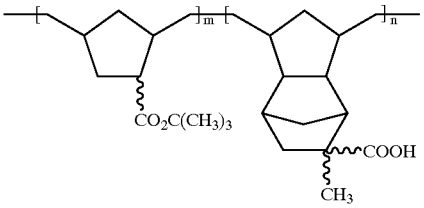 Poly(CBN-co-MTDCA) | 0.8 |
| 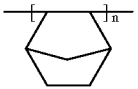 Poly(norbornene) | 0.31 |
| APEX-B DUV Resist | 1.0 |
| I-line Resist | 0.75 |
| Poly(hydroxystyrene) | 0.59 |

Thermal Analysis

Figure 4:
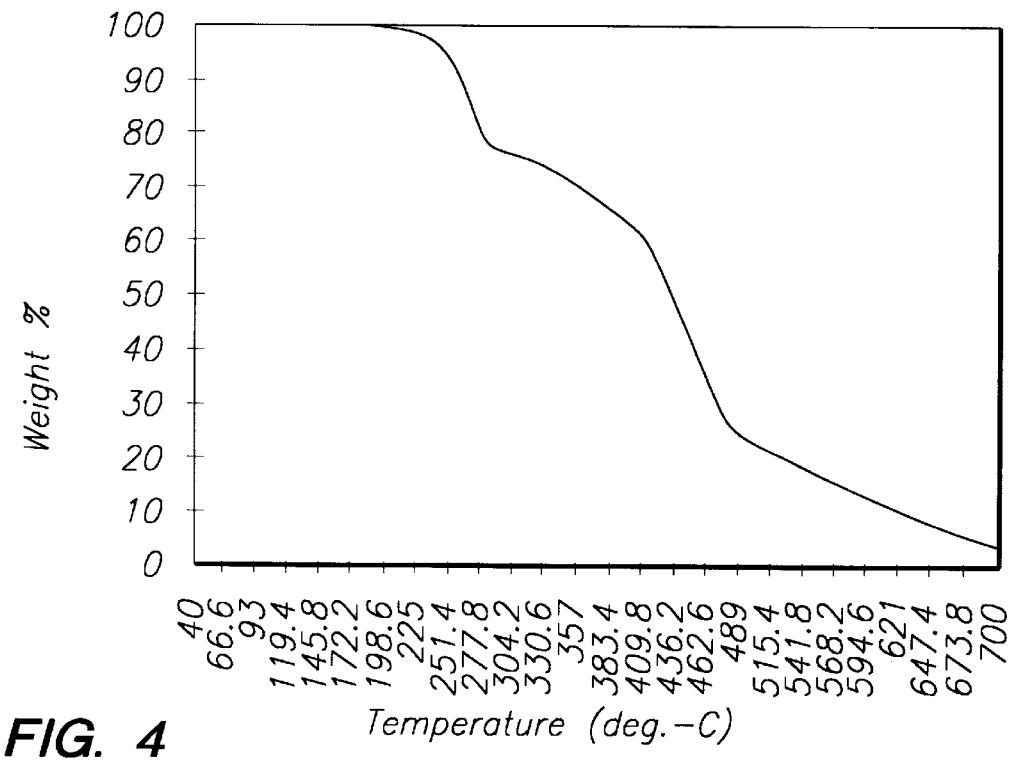
FIG. 4. TGA curve of poly(CBN-co-NBCA) showing thermal resistance of the polymer. All polymers show similar TGA profiles. The deprotection and decomposition temperatures for the polymers are roughly 250° C. and 400° C., respectively. The glass transition temperature (Tg) of the ROMP derived poly(CBN) is 90° C.; the vinyl addition and free radical derived poly(CBN) show no thermal transition below the decomposition temperature at 250° C.

The thermal stability of the polymers is shown in FIG. 4. All polymers show similar TGA profiles, similar to that shown in FIG. 4. The deprotection temperature and decomposition temperature for the polymers are roughly 250° C. and 400° C., respectively. The glass transition temperature (Tg) of the ROMP derived poly(CBN) is 90° C.; the vinyl addition and free radical derived poly(CBN) show no thermal transition below the decomposition temperature at 250° C.

UV Absorption Analyses of Resist Polymers

Resist polymer was dissolved in PGMEA at 16% by weight relative to solvent and spin coated at 2500 RPM on a 1 in. quartz wafers and then heated at 150° C. for 60 s, after which, the thickness of the film and the UV absorbance were recorded. Table 6 is a summary of the transparency of the resist polymers at 193 nm and 248 nm. These materials have acceptable transparency at 193 nm in light of the fact that resist film thickness for 193 nm resist applications are constrained to be quite thin, in fact, less than 0.5 μm in certain cases. The transparency of these resist polymers at 193 nm is, on the average, greater than 90% at 0.4 μm.

IR Study of the Radiation-Exposed Resist Films

The resist solutions were spin coated at 2500 RPM to produce ~0.7 mm films on 8 in. double polished silicon wafers and heated at 150° C. for 60 s (unless otherwise stated) in hard contact with the bake plate. Following exposure to known doses ranging from 0–50 mJ/cm² on a GCA XLS KrF (248 nm) excimer laser stepper, the wafer was baked with minimal delay (<5 min) for 60 s at 150° C. This was repeated for post-exposure bake temperatures of 140, 130 and 120° C.

When the photoacid generator, triphenylsulfonium hexafluoroantimonate is irradiated, it decomposes to release hexafluoroantimonic acid, in the resist film. This photochemical reaction occurs at room temperature. The acid-catalyzed deprotection of the tert-butyl ester that masks the pendant carboxylic acid group of the polymer occurs at elevated temperature. It is therefore necessary to heat the resist film to an appropriate temperature (postexposure bake) to provide the energy required for the acid-catalyzed thermolysis. The extent of deprotection is dependent on the exposure, post bake temperature and post bake time. By monitoring the carboxylic acid OH stretch 3000–3600 cm⁻¹, the ester carbonyl (C=O) around 1735 cm⁻¹ and acid carbonyl (C=O) around 1705 cm⁻¹, it is possible to determine the dose-dependence of the deprotection reaction, as well as the influence of baking temperature on the extent of deprotection of each resist system. Doses ranging from 0–50 mJ/cm² were applied to each resist system, after which the samples were baked at 120, 130, 140, and 150° C., and then analyzed by FTIR.

Figure 5:
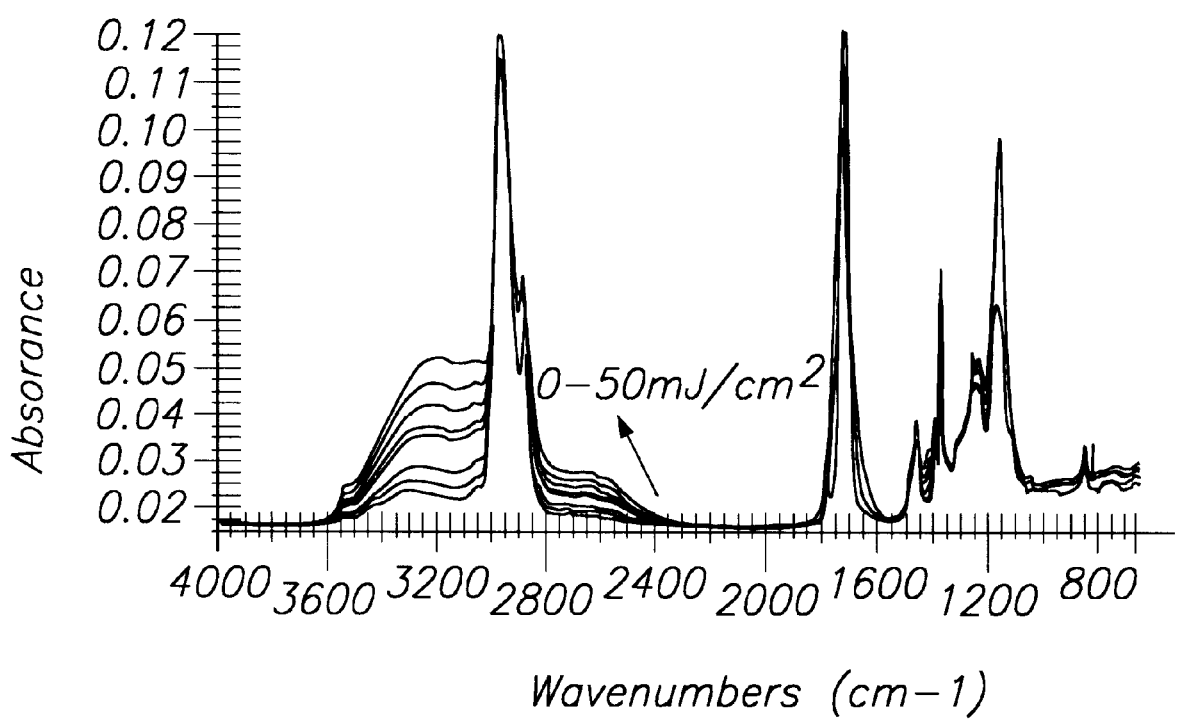
FIG. 5. Change in FTIR Spectra of radical copolymer as a function of dose. A typical IR spectra of resist formulated with triphenyl sulphonium hexafluoroantimonate and poly(carbo-t-butoxynorbornene-co-norbornene carboxylic acid), exposed to 0 to 50 mJ/cm$^2$ of 248 nm radiation and post baked at 130° C. for 60 seconds. Similar spectra were collected at 120° C., 140° C. and 150° C.

FIG. 5 shows typical IR spectra of resist formulated with triphenyl sulphonium hexafluoroantimonate and poly(carbo-t-butoxynorbornene-co-norbornerne carboxylic acid), exposed to 0–50 mJ/cm² of 248 nm radiation and post baked at 130° C. for 60 seconds. Similar spectra were collected at 120° C., 140° C. and 150° C.

The intensity of the carboxylic acid OH stretch (3100–3600 cm⁻¹) and the carboxylic acid carbonyl (C=O) stretch (1695–1705 cm⁻¹) both increase, while the ester carbonyl (C=O) stretch (ca. 1720 cm⁻¹) decreases, with increasing dose of exposure (0 to 50 mJ/cm²), indicating the deprotection of the t-butyl ester group and the consequent coversion to a carboxylic acid. The C—O—C (1150 cm⁻¹) stretch of the ester also decreases with exposure dose.

Resist Imaging

Positive tone images were obtained with resists formulated with VAP, FRP and ROMP- derived polymers (FIG. 6, FIG. 7 & FIG. 8) on a GCA XLS 248 nm exposure tool. A summary of the unique features of each image is shown in Table 7.

TABLE 7

Results of the Lithographic Evaluations[1]

| Polymer | Minimum Features Resolved | Developer[2] Strength (N) | $E_0$ (mJ/cm$^2$) | Substrate | Limiting Characteristic |
|---|---|---|---|---|---|
| VAP | 0.2 μm trenches 0.6 isolated lines 0.5 μm L/S | 0.13 | 5–15 | BARL | Adhesion |
| ROMP | 0.2 μm isolated lines 0.8 μm trenches 0.7 μm L/S | 0.21 | 15–25 | bare silicon | Scumming |
| FRP | 0.7 μm trenches 0.6 μm isolated lines 0.8 μm L/S | 0.13 | 2–5 | CD-11 | Adhesion |
|  | 0.16 L/S[3] | 0.13[4] | 9 | HMDS | Sloping side wall |

[1]All resists were dissolved in PGMEA, spin-coated to a thickness of 0.5–0.7 μm, pre-exposure baked at 150° C., and post-exposure baked at 140° C. at 60 s.
Images were shot with 248 nm Stepper, unless otherwise stated.
[2]PD-523AD developer with surfactant.
[3]Image was shot with 193 nm Stepper, using a resist that was formulated with poly(CBN-co-MAH).
[4]This 0.13N tetramethylammonium hydroxide was obtained by diluting NMD developer.

EXAMPLE 9

Deprotection Kinetics of New 193 nm Resists Derived from Alicyclic Polymers

Infrared spectra were measured using a Nicolet Magna-IR™ FTIR/550 spectrometer. The resist solutions were spin coated at 2500 RPM to produce ~0.7 μm films on 8 in. aluminum backed double polished silicon wafers and heated at 150° C. for 60 s (unless otherwise stated) in hard contact with the bake plate. The Aluminum backed wafer technique follows from the works of Gamsky, et. al. (Gamsky, et. al. 1995) and allows quantitative measurement on thin films without interference fringes. Following exposure to known doses ranging from 0–50 mJ/cm$^2$ on a GCA XLS KrF (248 nm) excimer laser stepper, the wafer was baked with minimal delay (<5 min) for 60 s at 150° C. This experiment was repeated for post-exposure bake temperatures of 140° C., 130° C. and 120° C.

Infra-red spectroscopy provides a convenient method for studying the overall chemistry within the resist film before and after exposure and postbake. Using FTIR technique, the deprotection kinetics of resists films containing triphenylsulfonium hexafluoroantimonate were studied. These resists formulations were made from a series of cycloaliphatic co-polymers of 2-methylpropyl bicyclo(2.2.1)hept-2-ene-5-carboxylate (carbo-tert-butoxynorbornene), bicyclo(2.2.1) hept-2-ene carboxylate (norbornene carboxylic acid), 8-methyl-8-carboxytetracyclo(4,4,0.1$^{2,5}$,1$^{7,10}$)-dodec-3-ene (methyltetracyclododecene carboxylic acid) (MTDCA), and maleic anhydride. The co-polymers were synthesized by free radical, vinyl addition and ring opening metathesis polymerization techniques.

Upon exposure to UV-radiation, the photo acid generator (PAG) decomposes with rate constant $k_C$ to produce the photoacid (Acid), according to Equation (1). Here I is the intensity of the exposure radiation.

(1)

The generally accepted mechanism for the generation of acid from irradiation of triphenylsulfonium salt was reported by McKean (McKean 1990). The excited state of the sulfonium salt is believed to undergo homolytic cleavage of the carbon-sulfur bond to give an intermediate sulfur-centered radical cation along with phenyl radical. The photoacid (a Bronsted acid) is believed to arise from hydrogen atom abstraction by the radical cation followed by dissociation. Some investigators (Dectar and Hacker 1987) have observed phenylthiobiphenyl rearrangement products, which suggests that the acid may arise by photorearrangement followed by dissociation. Also, evidence has been presented which suggest that phenyl cation is produced by heterolytic cleavage of the excited state of the sulfonium salt (Gamsky et al. 1995).

Integrating Eq. (1) gives the acid concentration as a function of dose, as shown in Eq. (2).

$$[Acid]_{Dose}=[PAG]_0 \cdot (1-e^{-k_C \cdot Dose}) \quad (2)$$

The value for $k_C$ was taken from McKean et al. (1990) as the product of the PAG absorption and photoacid quantum yield at 254 nm.

In the presence of acid quenchers like plasticizing additives and dissolution inhibitors, which consume some of the generated acids (as shown in Eq. 3), the rate of acid depletion due to the quencher (Q) is given by Eq. (4):

(3)

$$\frac{d[Acid]}{dt} = -k_{loss} \cdot [Q] \cdot [Acid] + D\nabla^2[Acid] \quad (4)$$

where D is the diffusion coefficient. If the quenching is assumed to be instantaneous and irreversible, then the concentration of the photoacid at any time is given by Eq. (6)

$$[Acid]_t = [Acid]_{Dose} - [Q] \quad (5)$$

If $[Q] > [Acid]_{Dose}$, then $[Acid]_t = 0$ \quad (6)

If [M] is the concentration of the tert-butyl ester protected acid unit of the polymer, the reaction of the photoacid-catalyzed thermolysis (deprotection reaction) of the acid cleavable group of the polymer is given by Eq. (7), and the rate of deprotection of the acid cleavable group of the polymer (amplification rate) is given by Eq. (8). Here $k_a$ is the amplification rate constant, M is the tert-butyl ester unit and X is the deprotected carboxylic acid unit.

$$M + \text{Acid} \xrightarrow{k_a} X + \text{Acid} \qquad (7)$$

$$\frac{d[M]}{dt} = -k_a \cdot [\text{Acid}] \cdot [M] \qquad (8)$$

The amplification rate constant is given by the Eq. (9), where $E_a$ is the activation energy of the deprotection reaction, R is the universal gas constant, $A_a$ is the Arrhenius pre-exponential factor and T represents the bake temperature.

$$k_a = A_a e^{\frac{-E_a}{RT}} \qquad (9)$$

Eq. (9) can be linearized by logarithmic transformation, as shown in Eq. (10)

$$\ln K_a = \ln A_a - (E_a/RT) \qquad (10)$$

A plot of $\ln K_a$ versus $1/T$ gives a straight line, the slope of which is related to the activation energy, and the vertical intercept of which is related to the Arrhenius pre-exponential factor. Using numerical simulation of equations (2), (4), and (8), the deprotection extent can be modeled for various experimental conditions and values for $k_a$ obtained.

When the photo-initiator, triphenylsulfonium hexafluoroantimonate is exposed to radiation, it decomposes to release the super acid, hexafluoroantimonic acid, in the resist film. While this photochemical reaction can occur at room temperature, the acid-catalyzed deprotection of the pendant t-butyl group masking the carboxylic acid group of the resist polymer occurs at elevated temperature. It is therefore necessary to heat the resist film to an appropriate temperature (postexposure bake) to provide the energy that is required for the acid-catalyzed deprotection of the t-butyl group of the ester, which in turn, affords the base-soluble norbornene carboxylic acid unit; isobutylene volatilizes. The extent of deprotection is dependent on the dose of applied radiation. By monitoring the carboxylic acid OH stretch 3000–3600 cm$^{-1}$ and the ester carbonyl (C=O) around 1735 cm$^{-1}$, acid carbonyl (C=O) around 1705 cm$^{-1}$, and ester (C—O—C) stretch around 1150 cm$^{-1}$, it was possible to determine the extent of dose-dependent deprotection, as well as the influence of baking temperature on the extent of deprotection of each resist system by IR spectroscopy. Doses ranging from 0–50 mJ/cm$^2$ were applied to each resist system, after which they were baked at 120° C., 130° C., 140° C., and 150° C. for 60 secs and analyzed by FTIR.

FIG. 10 shows a typical family of IR spectra of a resist formulated with triphenyl hexafluoroantimonate and poly (carbo-t-butoxy norbornene-co-norbornerne carboxylic acid), samples of which were exposed to radiation doses of 0–50 mJ/cm2 and post baked at 130° C. after exposure. Similar spectra were collected at 120° C., 140° C. and 150° C.

FIG. 11 shows the dose-dependent profiles of the carboxylic OH stretch (3100–3500 cm$^{-1}$) and the ester C—O—C stretch (around 1150 cm$^{-1}$) of a typical resist at 120° C., 130° C., 140° C. and 150° C. The carboxylic acid OH stretch and the carboxylic acid carbonyl (C=O) stretch (1695–1705 cm$^{-1}$) both increase, while the ester carbonyl (C=O) stretch (1730–1735 cm$^{-1}$) decreases with increasing dose of exposure (0 to 50 mJ/cm$^2$), which allows the deprotection of the t-butyl ester group and the consequent conversion to a carboxylic acid group to be followed spectroscopically. The C—O—C (1150 cm$^{-1}$) stretch of the ester also decreases with dose of exposure, indicating the loss of the isobutylene group from the resist polymer. The slight shift between the ester carbonyl (C=O) stretch and the acid carbonyl (C=O) stretch is due to hydrogen bonding involving the carboxyl OH attached to the acid carbonyl (C=O).

Using the model, it was possible to simulate the deprotection kinetics of these resists. FIG. 11 is a plot of the extent of deprotection for postexposure baking at 150° C. FIG. 11 shows the concentration-time profile of the carboxylic acid (monitored with the carboxylic OH stretch in 3000–3600 cm$^{-1}$ band) formed during the baking process and the concentration-time profile of the t-butyl ester protecting group as monitored with the C—O—C stretch around 1150 cm$^{-1}$). The baking time lasted for 60 seconds. The values obtained for postexposure bakes at 120° C., 130° C., 140° C. and 150° C. were consistent with the values predicted by the model. In all the cases, the modeling results are reasonably consistent with the experimental values. Thus, the model describes the deprotection kinetics of these resist systems.

FIG. 12 is an Arrhenius-type plot of the deprotection kinetics of resists formulated with vinyl addition and free radical copolymers. The activation energy for the deprotection of the pendant-t-butyl group of resists formulated with poly(carbo-t-butoxy norbornene-co-norbornene carboxylic acid) made by vinyl addition and free radical techniques was determined to be 6.7 and 9.4 Kcal/mol, respectively, over the temperature range of 120–150° C.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated herein by reference.

U.S. Pat. No. 4,491,628.
U.S. Pat. No. 2,721,189.
German Patent No. 1072811.
Semiconductor Industry Association (SIA), *The National Technology Roadmap for Semiconductors*, San Jose, Calif., pp 81–93, 1994.
Allen et al. *J. Photopolym. Sci. Technol.*, 6(4):575, 1993.
Allen et al. *J. Photopolym. Sci. Technol.*, 9(3):465, 1996a.
Allen et al. *Proc. SPIE*, 2724:334, 1996b.
Aylward and Sawistowska, *Chemistry and Industry*, 484, 1962.
Cannizzo and Grubbs, *Macromol.* 20:1488, 1987.
Cannizzo and Grubbs, *Macromol.* 21:1961, 1988.
Chandross et al. *Can. J. Chem.*, 61:817, 1983.
Collman et al. *Principles and Applications of Organotransition Metal Chemistry*; University Science Books: Mill Valley, Calif., 1987.

Crivello, *Proc. Reg. Tech. Conf. on Photopolymers; mid-Hudson section, SPE,* November 8–10, Ellenville, N.Y.; pp 267–284, 1982.
Crivello and Lam, *J. Org. Chem.,* 43:3055, 1978.
Davidson and Goodin, *Eur. Polym. J.,* 18:487, 1982.
Dectar and Hacker, *J. Chem. Soc., Chem. Commun.,* 1591, 1987.
Feely, *Proc. SPIE,* 631:48, 1986.
Feely et al. *Polym. Eng. Sci.,* 16:1101, 1986.
Fournier, *Inorg. Synth.,* 27:80, 1990.
Frechet et al. *Proc. Microcircuit, Eng.,* 260, 1982.
Frechet et al. *Polymer,* 24:995, 1983.
Gamsky et al. *Proc. SPIE,* 2438:143, 1995.
Gaylord et al. *J. Polym. Sci. Polym. Lett. Ed.,* 14:555, 1976.
Gaylord et al. *J. Macromol. Sci., Chem.,* A11:1053, 1977.
Gilliom and Grubbs, *J. Am. Chem. Soc.,* 108:733, 1986.
Gokan et al. *J. Electrochem. Soc.: Sol. -State Sci. Technol.,* 130:143, 1983.
Hahn, *J. Polym. Sci., Polym. Chem. Ed.,* 30:397, 1992.
Hattori et al. *Proc. SPIE,* 1925:146, 1993.
Hayashi et al. *Polym. Mater. Sci. Eng.,* 61:417, 1989.
Houlihan et al. *Macromolecules,* 19:13, 1986.
Houlihan et al. *Polym. Mater. Sci. Eng.,* 66:38, 1992.
Hur et al. *Inorg. Synth.,* 27:77, 1990a.
Hur et al. *Inorg. Synth.,* 27:78, 1990b.
Itoh and Willson, *SPE Regional Technical Conference in Photopolmers,* Ellenville, N.Y. November, 1982.
Ito et al. *Macromolecules,* 16:510, 1983.
Jiang and Basset, *Polym. Mater. Sci. Eng.,* 66:41, 1992.
Kaimoto et al. Proc. SPIE, 1672:66, 1992.
Kennedy and Makwoski, *Macromol Sci.-Chem.,* A-1:345, 1967.
Klemperer and Yaghi, *Inorg. Synth.,* 27:83, 1990.
Kunz et al. *Proc. SPIE,* 1925:167, 1993.
Kunz et al. *Proc. SPIE,* 2724:365, 1996.
Lee and Frechet, *Chem Mater.,* 6:1830, 1994.
MacDonald et al. *Chem. Mater.*3:435, 1991.
McKean et al. in *Microlithography Materials and Processes*; Reichamanis et al. eds., ACS Symposium Series 412: American Chemical Society: Washington, D.C., pp 26–38, 1990.
Mackean et al. *Proc. SPIE,* 920:60, 1988.
Mathew et al. *Macromol.,* 29:2755, 1996.
Mehler and Risse, *Makromol. Chem. Rapid Commun.,* 12:255, 1991.
Mehler and Risse, *Macromol.,* 25:4226–4228, 1992.
Michelotti and Keaveney, *J. Polym. Sci. A,* 3:895, 1965.
Miller, *J. Chem. Educ.,* 42(5):255, 1965.
Murata et al. *Proc. SPIE.* 1262:8, 1990.
Murzdek and Schrock, *Macromol.,* 20:2640, 1987.
Nalamasu et al. *Proc. SPIE,* 1262:32, 1990.
O'Brien, *J. Polym. Eng. Sci.,* 29:846, 1989.
O'Brien and Crivello, *Proc. SPIE,* 920:42, 1988.
Pawlowski et al. *Proc. SPIE,* 1262:16, 1990.
Przybilla et al. *J. Photopolym. Sci. Technol.,* 5:85, 1992.
Reck et al. *Polym. Eng. Sci.,* 29:960, 1989.
Reichmanis, et al. *J. Vac. Sci. Technol.,* 19:1338, 1981.
Reichmanis et al. *J. Electrochem. Soc.,* 130:1433, 1983a.
Reichmanis et al. *J. Polym. Chem. Ed.,* 21:1075, 1983b.
Reichmanis et al. *J. Electrochem. Soc.,* 134:653, 1987.
Reichmanis et al. *Chem. Mater.,* 3:394, 1991.
Rhinehart and Smith, *J. Polym. Sci. B,* 1049, 1965.
Risse and Breunig, *Makromol. Chem.,* 193:2915, 1992.
Safir et al. *Macromol.,* 28:5396–5398, 1995.
Sartori and Ciampelli, F.; *Cameli, N. Chim. Ind.* (Milano), 45:1478, 1963.
Schaverien et al. *J. Am. Chem. Soc.,* 108:2771.
Schenker et al. *J. Vac. Sci.,* November/December:3275, 1994.
Schenker et al. *Proc. SPIE,* 2440:118, 1995.
Schenker et al. *Proc. SPIE,* 2726:698, 1996.
Schlegel et al. *Chem. Mater.,* 2:299, 1990.
Schram and Wayland, *J. Chem. Soc., Chem. Commun.,* 898, 1968.
Schrock et al. *Macromol.,* 20:1169, 1987.
Schulz, *Polym. Lett.,* 4:541, 1996.
Schwalm, *Polym. Mater. Sci. Eng.,* 61:278, 1989.
Sen and Lai, *Organometallics,* 1:415, 1982.
Sen et al. *J. Organomet. Chem.,* 358:567, 1988.
Tanielian et al. *Can. J. Chem.,* 57:2022, 1979.
Tarascon et al. *Polym. Eng. Sci.,* 29:850, 1989.
Taylor et al. *Chem. Mater.,* 3:1031, 1991.
Thompson et al. Introduction to Microlithography, 2d ed., ACS Press, 1994.
Truett et al. *J. Am. Chem. Soc.,* 82:2337, 1960.
Tsujino et al. *Makromol. Chem.,* 85:71, 1965.
Uchino et al. *Proc. SPIE,* 1446:429, 1991.
Uchino et al. *Microelectron. Eng.,* 17:261, 1992.
Wallace and Schrock, *Macromol.,* 20:450, 1987.
Wallace et al. *Organometallics,* 5:2162, 1986.
Wallraf et al. *Polym. Mater. Sci. Eng.,* 66:49, 1992.
Willson et al. *Proceedings of IUPAC 28th Symposium on Macromolecules,* Amherst, Mass., p. 448, July 1982.
Willson et al. *J. Electrochem. Soc.,* 133:181, 1986.

What is claimed is:

1. A photoresist composition comprising a polymer of a t-butyl ester of norbornene carboxylic acid analog, a photo acid generator, and a plasticizer, wherein the plasticizer comprises a di-tert-butyl ester of a polycyclic di-carboxylic acid.

2. The photoresist composition of claim 1, wherein the plasticizer is 4,8-di-t-butyl-tricyclo($5.2.1.0^{2,6}$) decanedicarboxylate.

3. A photoresist composition comprising a polymer of a norbornene having an acid cleavable group pendant from the polymer backbone, a photo acid generator, and a plasticizer, wherein the plasticizer comprises a di-tert-butyl ester of a polycyclic di-carboxylic acid.

4. The photoresist composition of claim 3, wherein the plasticizer is 4,8-di-t-butyl-tricyclo($5.2.1.0^{2,6}$) decanedicarboxylate.

* * * * *